(12) United States Patent
Kotyk et al.

(10) Patent No.: US 7,367,155 B2
(45) Date of Patent: May 6, 2008

(54) APPARATUS AND METHODS FOR ANALYZING AND IMPROVING AGRICULTURAL PRODUCTS

(75) Inventors: John J. Kotyk, Manchester, MO (US); Kevin L. Deppermann, St. Charles, MO (US)

(73) Assignee: Monsanto Technology LLC, St. Louis, MO (US)

(*) Notice: Subject to any disclaimer, the term of this patent is extended or adjusted under 35 U.S.C. 154(b) by 644 days.

(21) Appl. No.: 09/739,871

(22) Filed: Dec. 20, 2000

(65) Prior Publication Data

US 2006/0112628 A1    Jun. 1, 2006

(51) Int. Cl.
*A01C 1/00* (2006.01)

(52) U.S. Cl. .......................... 47/14; 47/58.1 R

(58) Field of Classification Search ............. 47/58.1 R, 47/14, 85, 87
See application file for complete search history.

(56) References Cited

U.S. PATENT DOCUMENTS

| | | | | |
|---|---|---|---|---|
| 3,530,372 | A | | 9/1970 | Laukien .................. 324/0.5 |
| 4,654,592 | A | | 3/1987 | Zens ..................... 324/307 |
| 4,931,061 | A | * | 6/1990 | Young .................... 47/57.6 |
| 5,051,699 | A | * | 9/1991 | Hanawa et al. .......... 324/309 |
| 5,221,518 | A | | 6/1993 | Mills ..................... 422/62 |
| 5,253,302 | A | * | 10/1993 | Massen ................... 348/47 |
| 5,764,819 | A | * | 6/1998 | Orr et al. ................ 348/144 |
| 5,833,947 | A | * | 11/1998 | Rocklage et al. ........ 424/9.36 |
| 5,837,458 | A | | 11/1998 | Minshull et al. ............ 435/6 |
| 5,864,984 | A | * | 2/1999 | McNertney ............... 382/110 |
| 6,150,158 | A | * | 11/2000 | Bhide et al. ............. 221/211 |
| 6,237,286 | B1 | * | 5/2001 | Williames ................ 47/66.5 |

FOREIGN PATENT DOCUMENTS

DE    19845883 A1 *  5/1999

(Continued)

OTHER PUBLICATIONS

Song, et al., *Non-invasive Measurement of Moisture Distribution in Individual Wheat Kernels by Magnetic Resonance Imaging*, SPIE vol. 2345, Nov. 2-4, 1994.

(Continued)

*Primary Examiner*—Son T. Nguyen
(74) *Attorney, Agent, or Firm*—James E. Davis; Joseph A. Schaper; Harness, Dickey & Pierce, P.L.C.

(57) ABSTRACT

A trait of interest is detected as being present within individual ones of a plurality of agricultural samples (such as seeds or plant tissues) by imaging the plurality of samples to form a magnetic resonance image. The image of the plurality of samples is then analyzed to detect image information indicative of the presence of the trait within one or more of the imaged samples. A determination is then made as to whether the trait is exhibited in individual ones of the samples based upon the foregoing analysis. As an example, the samples may be a plurality of seeds, and the detected trait may be oil. A determination is made, based on the image analysis, as to whether each individual seed in the multi-seed image contains oil. A further examination may be made to determine a relative content of oil in each seed as well as a content by weight.

36 Claims, 12 Drawing Sheets

Analysis of Corn Seed MRI Data

FOREIGN PATENT DOCUMENTS

| | | | |
|---|---|---|---|
| EP | 0 730 164 | | 9/1996 |
| EP | 0 750 188 | | 12/1996 |
| JP | 406284806 A | * | 10/1994 ............... 47/58.1 |
| JP | 10 319106 | | 4/1998 |
| WO | WO 97/00887 | | 1/1997 |
| WO | WO 99/41383 | | 8/1999 |
| WO | WO 00/52990 | * | 9/2000 |
| WO | WO 01/44828 A1 | | 6/2001 |
| WO | WO 01/89288 A1 | | 11/2001 |

OTHER PUBLICATIONS

G. Rubel, *Simultaneous Determination of Oil and Water Contents in Different Oilseeds by Pulsed Nuclear Magnetic Resonance*, JAOCS, vol. 71, No. 10, Oct. 1994.

Gambhir, et al., *Simultaneous Determination of Moisture and Oil Content in Oilseeds by Pulsed Muclear Magnetic Resonance*, JOACS, vol. 62, No. 1, Jan. 1985.

McEntyre, et al., *Comparison of Water Absorption Patterns in Two Barley Cultivars, Using Magnetic Resonance Imaging*, AACCI, Cereal Chemistry, vol. 76, No. 6, pp. 792-795, 1998.

Bauman, et al., *Inheritance of Variation in Oil Content of Individual Corn Kernels*, Crop Science, vol. 5, pp. 137-138, 1965.

MacNamara, et al.; "Multiplex Sample NMR: an Approach to High-Throughput NMR Using a Parallel Coil Probe"; *Analytica Chimica Acta*; vol. 397, No. 1/03; Elsevier Science B.V.; Oct. 1999, pp. 9-16.

K. Saito, et al., "Application of magnetic resonance imaging to non-destructive boid detection in watermelon", XP 000656797, *Cryogenics*, vol. 36, No. 12, 1996.

J. M. Halloin, et al., "Proton Magnetic Resonance Imaging of LIpd in Pecan Embryos", XP 001080187, *Journal of the American Oil Chemists' Society*, vol. 70, No. 12, Dec. 1993.

J. R. Heil, et al., "Magnetic Resonance Imaging adn Modeling of WaterUp-take into Dry Beans", XP 002202044, *Dept. of Food Science and Technology, University of California*, Davis, CA, Jan. 23, 1992.

Guy Rubel, "Simultaneous Determination of Oil and Water Contents in Different Oil Seeds by Pulsed Nuclear Magnetic Resonance", XP 001080188, *JAOCS*, vol. 71, No. 10, Oct. 1994.

M. R. Lakshminarayana, et al., "Spatial distribution of oil in groundnut and sunflower seeds by nuclear magnetic resonance imaging", XP 002201726, *J. Biosci.*, vol. 17, No. 1, Mar. 1992, pp. 87-93.

International Search Report, PCT/US01/49823, dated Oct. 21, 2002.

* cited by examiner

50-Slice Image "Data Cube"

Layer Image

"Clean" Layer Image

APPARATUS AND METHODS FOR ANALYZING AND IMPROVING AGRICULTURAL PRODUCTS

FIELD OF THE INVENTION

The present invention relates to devices and methods for analyzing agricultural products. More particularly, the present invention relates to devices and methods for rapid, non-destructive analysis of the physical and chemical characteristics of one or more seeds, and methods for breeding plants to produce new plants with desirable physical and chemical characteristics.

BACKGROUND OF THE INVENTION

Breeding for compositionally enhanced agricultural products can require the analysis of a large number of seed samples from plants to identify those plants with the desired compositional and agronomic properties for use or advancement to the next generation. Analysis of bulk seed batches for certain traits, such as high oil or protein content, on a single plant or ear, in conjunction with an appropriate breeding methodology such as recurrent selection, often allows for the selection and introduction of such traits into a commercial population. Although the analysis of these seed batches can be performed by various techniques, methods that are rapid, low cost, and non-destructive are the most desirable.

Magnetic resonance imaging (MRI) is based on a non-invasive spectroscopic technique known as nuclear magnetic resonance (NMR). NMR requires the sample under investigation to contain atoms that exhibit nuclear spin, an intrinsic quality makes the atomic nuclei magnetic. The most common atom with nuclear spin is hydrogen, whose nucleus is a proton with spin ½. A typical proton NMR ($^1$H NMR) experiment involves placing a sample to be studied in a strong homogeneous magnetic field. The strong magnetic field causes preferential alignment of the protons in the sample with the magnetic field, a phenomenon that is analogous to a magnetic compass needle aligning with the earth's magnetic field. In a simple modern "pulsed-NMR" experiment, another magnetic field (the radiofrequency, or RF field) is transiently applied to the sample, which has the effect of rotating the aligned protons to a higher energy state, which is perpendicular to the strong magnetic field (this is called a 90° pulse). The protons precess at characteristic rates as they realign with the strong field, thus inducing a current in a pair of coils that serve as the detector. The current is measured in the detection coils as a function of time, and from this the rates of precession of the protons in the sample are inferred. The rates of precession are determined primarily by the strength of the strong magnetic field (with stronger fields leading to greater precession rates), but the unique molecular environment experienced by each of the protons also has an effect on the rate of precession. It is the unique molecular environment that is the object of study in NMR experiments.

In a slightly more complicated modern pulsed NMR experiment, the complexity of the signals arising from multiple molecular environments can be eliminated, leaving only the signals from protons in a selected subset of molecular environments. This approach, called the "spin-echo" experiment, can be used, for example, on a sample comprising a mixture of oil and water to eliminate the signal arising from the protons in water molecules, and to leave only signals arising from protons in oil molecules. This can be accomplished by using a series of RF pulses of 90° and 180°, and commercial instruments typically come with software that is useful for programming the instrument to properly execute the pulse sequence.

Non-imaging NMR-based technology for measuring characteristics such as oil content in intact seeds requires measurement of bulk samples and is unable to distinguish characteristics of individual seeds. These low-field pulsed NMR methods rely on differentiation of oil from other components in the seed based on inherent differences in longitudinal and spin-spin nuclear relaxation rates between oil and other protonated species. NMR methods used to measure oil have been standardized, they are non-destructive, robust, and they yield both accurate and reproducible results. But low-field NMR methods are performed at low magnetic field strengths, which yields poor signal-to-noise relative to the MRI experiment, and consequently, these methods offer a poor approach for single-seed analysis. The MRI method for measuring oil content is based on the same physical principles described in pulsed NMR studies. The difference is that MRI provides spatially encoded NMR signals, providing displays of data in an image format rather than a conventional NMR spectrum.

Another similarity exists between conventional NMR studies and the MRI method for measuring oil levels in single seeds. Both methods provide a relative oil content for seeds on a percent basis (wt/wt) by comparing the experimental results with oil calibration standards, which is the generally accepted and useful method for comparing oil levels in single seeds. See Tiwari et al., "Rapid and nondestructive determination of seed oil by pulsed nuclear magnetic resonance technique," *J. Am. Oil Chem. Soc.* 51: 104-109 (1974). Relative numbers are obtained because a small portion of the NMR signal intensity is lost during the timing delays incorporated into the data acquisition schemes. The relative numbers can be corrected to absolute numbers by normalizing the data using an independent oil measurement for a given population of seeds, e.g., the average of the measured oil value for the population is set to the oil value determined in a bulk measurement and all individual seeds are adjusted accordingly. Absolute oil numbers also can be obtained using NMR spectroscopy and MRI methods by using seed standards in the analysis. In this case, the oil content of a seed is determined absolutely since the seed standard more closely matches the nuclear relaxation and wax content of the experimental seed. However, absolute oil numbers have been shown to be less precise for comparing relative oil levels between seeds. See Rubel, "Simultaneous determination of oil and water contents in different oilseeds by pulsed nuclear magnetic resonance," *J. Am. Oil Chem. Soc.* 71: 1057-1062 (1994).

While the best NMR instruments require extremely homogenous magnetic fields, MRI machines purposely induce field gradients (variations in magnetic field strength with respect to position) using three gradient magnets. The gradient magnets are much weaker than the strong. magnet, but they are sufficient to cause distinguishable proton precession rates at different parts of the sample. Modern MRI machines pulse not only the RF field, but also the gradient fields, in order to selectively rotate and selectively detect protons in particular regions of the sample. Measurement of the signal strength of the various frequency components (precession rates) indicates the density and relaxation times (the time it takes particular protons to relax back to their original low-energy state and re-align with the strong magnetic field, the longitudinal relaxation time, and to precess out of phase, or dephase due to spin-spin relaxation, with respect to the other protons) of protons at various locations in the sample.

MRI methods provide direct measurements of characteristics such as oil levels, thus providing a primary assay independent of a chemometric model. Thus a three dimensional image can be constructed where the intensities at various points in the image relate to the densities and relaxation times of protons at those points in the sample. Furthermore, because different molecular environments result in different precession frequencies, the molecular environment at each point in the sample can be determined. Such an approach is called "chemical shift imaging" (CSI).

An alternative to CSI is "spin echo imaging" (SEI). In this experiment, one class of protons can be singled out (based on their dephasing rates), and the signals from all other protons can be suppressed. For example, if a sample contains spatially separated oil and water, and a SEI experiment is directed to detecting the oil, then the resulting image will show only those regions of the sample in which oil is found.

MRI is a well-known non-invasive radiological technique commonly used in the medical sciences. The long-wavelength (radio wave) radiation is universally regarded as less harmful than the forms of radiation used in other types of non-invasive radiological techniques such as X-ray CAT (computed axial tomography) scans. As early as 1988, MRI techniques were starting to be applied to the study of plants. See Introduction section of Lakshminarayana et al., "Spatial distribution of oil in groundnut and sunflower seeds by nuclear magnetic resonance imaging," *J. Biosci.* 17(1): 87-93 (March 1992) (hereinafter Lakshminarayana et al.) (describing a history up to 1992 of the use of MRI in the study of plants, seeds, and plant tissue). Lakshminarayana et al. describe an experiment in which MRI was used on single seeds to determine the spatial distribution of oil and water in single seed samples. They used a spin echo pulse sequence to selectively detect only the protons that were part of oil molecules. MRI was also used to study water uptake in dry kidney beans by Heil et al., "Magnetic resonance imaging and modeling of water up-take into dry beans," *Lebensm.-Wiss. u.-Technol.* 25:280 (1992).

Both SEI and CSI MRI were used to image lipids in pecan embryos by Halloin et al., "Proton magnetic resonance imaging of lipid in pecan embryos," *J. Am. Oil Chemists' Soc.* 70:1259 (1993). These experiments studied the differences in the images of pecan embryos that were normal, infected by fungus, and damaged by insects. The CSI MRI experiment showed the distribution of lipids and water within the pecan embryos.

Other MRI techniques are known to those skilled in the art. One example is relaxography, or relaxation time mapping. In this technique, different regions of a sample being imaged are distinguished based on the differences in relaxation times of the protons in the different regions.

MRI experiments on seeds have traditionally been conducted using research grade MRI instruments, for example, the Bruker AMX-400 9.4 Tesla instrument with an 8.9 cm diameter bore (Bruker Instruments Inc., Billerica, Mass.) or the GE Omega system 7.1 Tesla instrument with a 15 cm diameter bore (General Electric, Milwaukee, Wis.). These instruments typically have a bore size of a few centimeters, and consequently can only be used to study samples that are smaller than the bore size. The advantage of the small scale of these instruments is that the detection coils are close to the sample under investigation, and therefore their sensitivity is very high. Larger research grade MRI instruments also exist with bore sizes and detection coil diameters of 20-50 cm, for example, the Bruker Biospec II 4.7 Tesla, 40 cm diameter bore (Bruker Instruments, Inc., Billerica, Mass.). These instruments are useful for imaging of mice and other small animals. Clinical MRI instruments, on the other hand, must have a bore size and detection coils that are large enough to accommodate a human body. For example, Siemens (Siemens AG, Erlangen, Germany) and GE Medical Systems (Milwaukee, Wis.) manufacture a wide range of clinical instruments that can accommodate objects with 50 cm diameters and larger. Some newer systems with permanent magnets with magnetic fields as low as 0.2 Tesla are not limited by bore size, but by coil diameter. But the larger diameter detection coils in traditional superconducting instruments, as well as newer permanent magnet systems, make these clinical instruments ill-suited for imaging small samples such as seeds. The large distance of the detection coils from a small sample and the inherently weak signal emanating from a small sample conspire to make conventional approaches to quantitative imaging of small samples using clinical MRI instruments impractical. But the small volumes of small bore size research MRI instruments do not allow the simultaneous imaging of as many seeds as a clinical MRI instrument would allow if the larger MRI instruments were amenable to detecting signals from small samples.

Conventional non-invasive methods for bulk seed analysis, such as infrared (IR) spectroscopy, suffer from the disadvantage of being rather time-intensive and producing results that may not be fairly representative of the sample analyzed. Time-intensive techniques for finding desirable characteristics are especially disadvantageous to selective plant breeding programs, where many single seeds need to be screened rapidly in order to allow seed selection before the next planting generation. Delays in providing the breeder with the analytical results can cause the loss of an entire breeding cycle.

Non-imaging techniques such as IR spectroscopy suffer from the further disadvantage of collecting information from only a subset of a total sample by spot sampling only portions of only a few seeds out of the hundreds of seeds in the bulk sample. Furthermore, since spot sampling interrogates arbitrary portions of the seed, different tissues of the seeds in the samples can be misrepresented by the analytical data. Since qualities like oil content are often present in different amounts in different tissues, non-imaging techniques can fail to accurately assess the desired quality. Non-imaging techniques disregard spatial information, and thus provide no information to a plant breeder about the size, shape, mechanical damage, insect infestation, or fungal damage.

Conventional seed analysis techniques also fail to provide an efficient method for single seed analysis, which can greatly accelerate the rate of varietal development. Single seed analysis is necessary to differentiate and select individual seeds from the heterogeneous population of seeds often encountered in breeding populations. Single seed analysis can reduce the number of generations required for the production of a plant with the desired trait. Single seed selection also reduces the number of individual plants required. In corn, for example, the ability to identify the individual seeds with the desired trait at the single seed level rather than at the whole ear level can reduce the nursery requirement by 100 fold. This makes it possible to conduct a far greater number of breeding projects with the same resources.

Other conventional analytical techniques, such as gas chromatography, also often fail to provide an efficient method for single seed analysis. For example, the conventional method for single seed analysis of canola requires manual excision of one half of each seed for fatty acid analysis by gas chromatography, while the other half is planted. Because of the manual sample preparation and the low throughput of this analytical technique, only a small number of samples can be run per hour using this process. Furthermore, this technique allows for the possibility of destroying analyzed seeds' potentials to grow into mature, seed bearing plants.

Although single seed analysis is desirable, conventional approaches and sampling methods do not allow for efficient processing of single seeds. Conventional techniques require extensive manual input, which limits the rate of development of plants with improved characteristics.

Conventional spectroscopic analysis techniques do not allow for the localization of chemical component levels within different tissues of seeds. Conventional approaches, such as manual dissection of the seed followed by chemical analysis by traditional analytical techniques, are not only laborious and destructive, they also result in poor resolution of the components and poor quantitation, since the sample size resulting from dissection of individual seeds is below the sample size at which most traditional techniques produce reliable results.

Needed in the art are devices and methods for rapid analysis of bulk and single seeds that can efficiently and non-destructively analyze the morphological and/or chemical characteristics of individual seeds, and that can be integrated into an agricultural processing machine. The present invention provides such devices and methods.

SUMMARY OF THE INVENTION

This invention provides devices and methods for the rapid, non-destructive analysis of any sample in order to determine the presence or absence of a trait of a specimen within that sample by using magnetic resonance imaging on either a single specimen, or on a plurality of specimens, and for using the information gained by the MRI analysis to select individuals exhibiting the characteristic from within a group of candidates potentially exhibiting the characteristic.

This invention further provides devices and methods for rapid, non-destructive analysis of the physical and chemical characteristics of one or more seeds or plant tissues and for using this analysis to selectively breed plants with one or more desired characteristics. The analysis is carried out on a sample of one or more seeds using MRI to measure one or more characteristics of the sample. Seeds exhibiting the desired characteristics can be selected to be grown from among many seeds analyzed. The invention is further useful for observing insect or fungal infestation, shapes of seeds, and damage to seeds.

The present invention includes and provides a method for determining whether a seed exhibits a trait, comprising: (A) providing the seed in a sampling device; (B) generating a magnetic resonance image of the seed; (C) analyzing the magnetic resonance image for the trait; and (D) determining whether the seed exhibits the trait based on the analysis, wherein the magnetic resonance image is obtained using a magnetic resonance imaging instrument with a bore size greater than about 20 cm.

The present invention includes and provides a method for determining whether any seeds within a sample comprising a plurality of seeds exhibit a trait, comprising: (A) providing the sample in a sampling device; (B) generating a magnetic resonance image of the sample; (C) analyzing the magnetic resonance image for seeds exhibiting the trait; and (D) determining whether seeds in the sample exhibit the trait based on the analysis, wherein the determining step comprises associating the seeds with corresponding image volume elements, and wherein the magnetic resonance image is obtained using a magnetic resonance imaging instrument with a bore size greater than 20 cm.

The present invention includes and provides methods for selectively breeding plants comprising imaging one or more seeds using a magnetic resonance imaging instrument, analyzing the image of the one or more seeds in order to determine whether any of the one or more seeds exhibits a trait or traits, selecting one or more seeds based on whether they exhibit the trait or traits, planting one or more seeds that exhibit the trait or traits, growing the resulting plants to maturity, and cross fertilizing the plants with each other or with other plants.

The present invention includes and provides a method for optimizing the field-of-view parameters and gradients in a magnetic resonance imaging instrument used to measure characteristics of a sample comprising seeds, comprising: (A) selecting a field of view that covers the entire sample; (B) selecting a number of image layers; (C) selecting an image layer thickness; (D) selecting a number of image pixels within each image layer, wherein the number of image layers multiplied by the image layer thickness is greater than about the height of the sample to be imaged, the image layer thickness is less than about the thickness of the seeds, and the number of image pixels is sufficient to prevent inter-pixel crosstalk.

The present invention includes and provides a sampling device for magnetic resonance imaging experiments comprising a spacer and a plurality of plates, wherein each plate is comprised of a plurality of wells and is slidably stacked and held by the spacer, and wherein the spacer and the plurality of plates consist of materials that are amenable to magnetic resonance experiments.

The present invention includes and provides a device for measuring properties of agricultural products, comprising: a sampling device for providing the sample, and a magnetic resonance imaging instrument for imaging the sample, wherein the magnetic resonance imaging instrument has a bore size greater than about 20 cm, wherein the sample exhibits an inductance that is substantially less than that of an approximately equivalent volume of water, and wherein the detection and RF coils of the magnetic resonance imaging instrument are loaded or retuned to be sensitive to the sample.

The present invention includes and provides a device for measuring properties of agricultural products, comprising: a processing device for producing a sample; a sampling device for providing a sample, wherein the sampling device is disposed to receive the sample from the processing device; and a magnetic resonance imaging system, wherein the system is disposed to analyze the sample in the sampling device.

The present invention includes and provides a device for measuring properties of N agricultural products, comprising: a sampling device for providing a sample; a magnetic resonance imaging system, wherein the system is disposed to analyze the sample in the sampling device; and a sorting device for sorting the sample into two or more different groups, wherein the sorting device is disposed to receive the sample from the sampling device.

The present invention includes and provides a device for measuring properties of agricultural products, comprising: a processing device for producing a sample; a sampling device for providing a sample, wherein the sampling device is disposed to receive the sample from the processing device; a magnetic resonance imaging system, wherein the system is disposed to analyze the sample in the sampling device; and a sorting device for sorting the sample into two or more different groups, wherein the sorting device is disposed to receive the sample from the sampling device.

DESCRIPTIONS OF THE DRAWINGS

FIG. 1 shows high resolution MRI images of four different corn kernels with different levels of oil content. These images indicate that kernel A (18.4% oil by weight) has a greater oil content than kernel B (7.8% oil by weight), which has a greater oil content than kernel C (5.7% oil by weight), which has a greater oil content than kernel D (2.8% oil by weight). These images used the spin-echo pulse sequence that imaged only protons that were part of oil molecules. Thus the darker regions indicate a higher oil content, while the lighter regions indicate a lower oil content.

FIG. 2 is a block diagram detailing the steps from the initial data collection from a sample cube containing multiple layers of seeds to the production of an array detailing the percent oil content by weight of each of the seeds within the sample. This block diagram shows the steps that can be applied to the raw data obtained from an MRI experiment to produce the final data array for the seeds in the form of percent oil content by weight for each seed within the sample cube. First, a three dimensional data set is collected from the sample cube to produce a three dimensional image data cube 101. (See FIG. 3 for an example of an image data cube.) Image analysis software such as IDL (interactive data language) is used to combine slices 102 comprising the data cube into a set of two dimensional images 103, where each of the resulting two dimensional images corresponds to a layer of the sample cube. (See FIG. 4a for a visual representation of one such layer image.) Other image analysis software can be used, and many examples of such software are known to those skilled in the art of image analysis. The image analysis software is used to apply a threshold filter 104 to each of the layer images based on the signal-to-noise ratio calculated using the first layer image to produce a "clean" layer image. (See FIG. 4b for a representation of a layer image resulting from the application of the threshold filter.) Other filters useful for this step are known to those skilled in the art of image analysis. The image analysis software is next used to locate the boundaries of individual seeds within each image layer 106, using an edge detection filter or another filter known to those skilled in the art of image analysis for locating objects within an image, to produce clean two-dimensional images of each seed within each layer of the sample cube 107. Next, the image analysis software is used to integrate the MRI image intensity for each seed within each layer of the sample cube 108. The integrated intensities are stored as a raw data array where each element of the raw data array is the integrated intensity corresponding to each seed in the sample cube 109. Finally, the information stored in the raw data array is combined with information about the weights of each seed within the sample cube 110 to calculate the relative percent oil by weight in each seed within the sample cube. The results of this calculation are stored in a processed data array where each element of the processed data array corresponds to the relative percent oil by weight in each seed within the sample array 111, which has not been corrected for imperfections in the main magnetic field, pulsed-field gradient, and inhomogeneous RF detection coil, collectively refered to as field defects. This data is further processed by incorporating the measured MRI intensity of a seed standard with known oil content in order to correct for field defects and produce an array of data containing the relative oil content of each seed within the sample cube.

Figure 5:
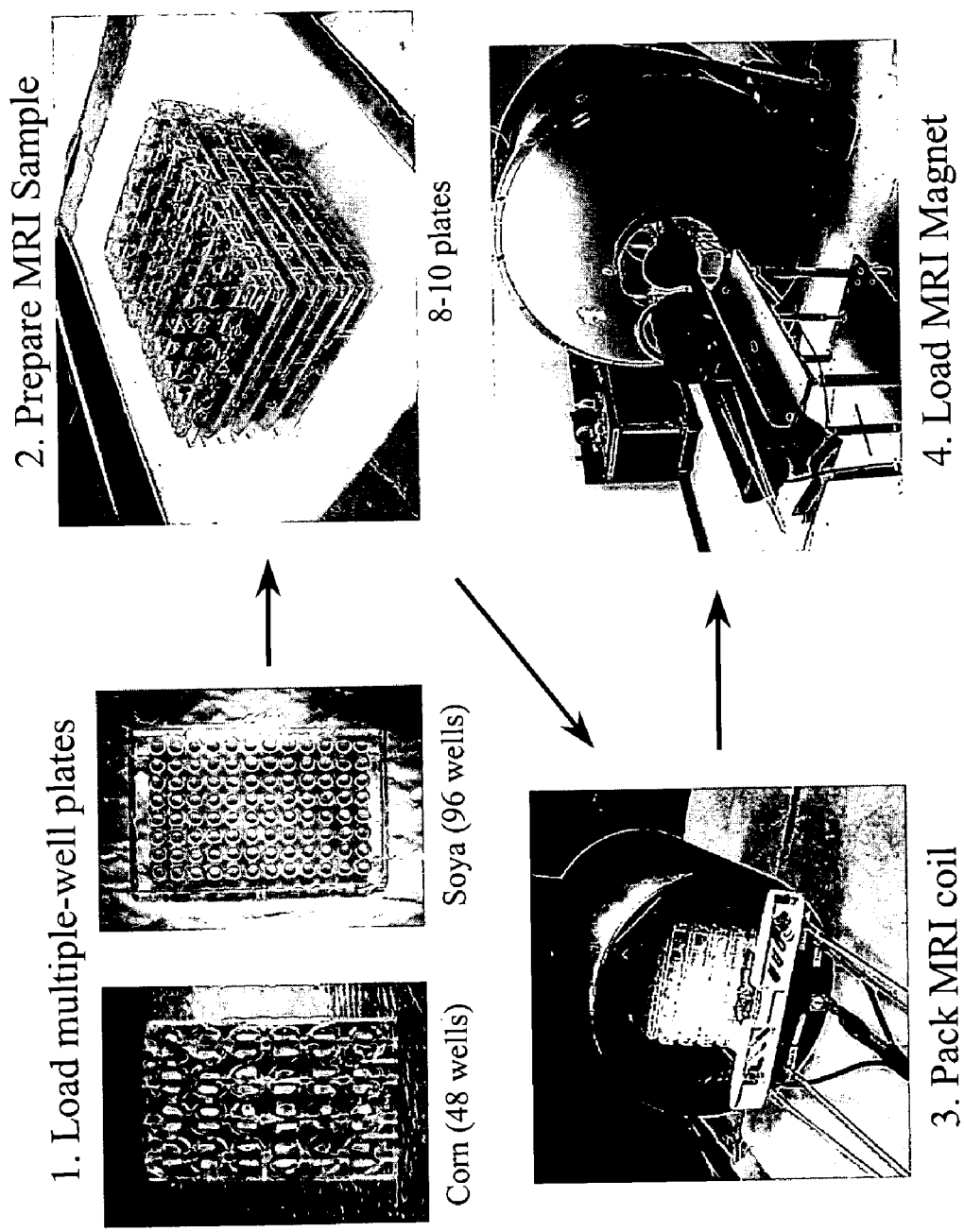

FIG. 5 shows the steps required to set up the MRI screening experiment of the invention. The fundamental steps of sample pre-analysis sample preparation for a high-resolution MRI experiment are shown. First, individual multi-well plates are loaded with the seeds of interest. In the two examples shown, corn kernels are loaded into a 48 well plate, and soybeans are loaded onto a 96 well plate. Smaller specimens can be loaded onto much denser well plates, for example, canola seeds can be loaded onto 960 well plates. Next, the plates are stacked in layers to make a sample cube. In this figure, there are two sets of four layers, for a total of 8 well plates. Much larger sample cubes are possible (for example, 12 or more layers are possible), but the size of the detection coil is a limiting factor in this particular example. The sample cube is packed into the RF coil, which is then loaded into the MRI magnet. The experiment is then ready to run.

Figures 6A, 6B:
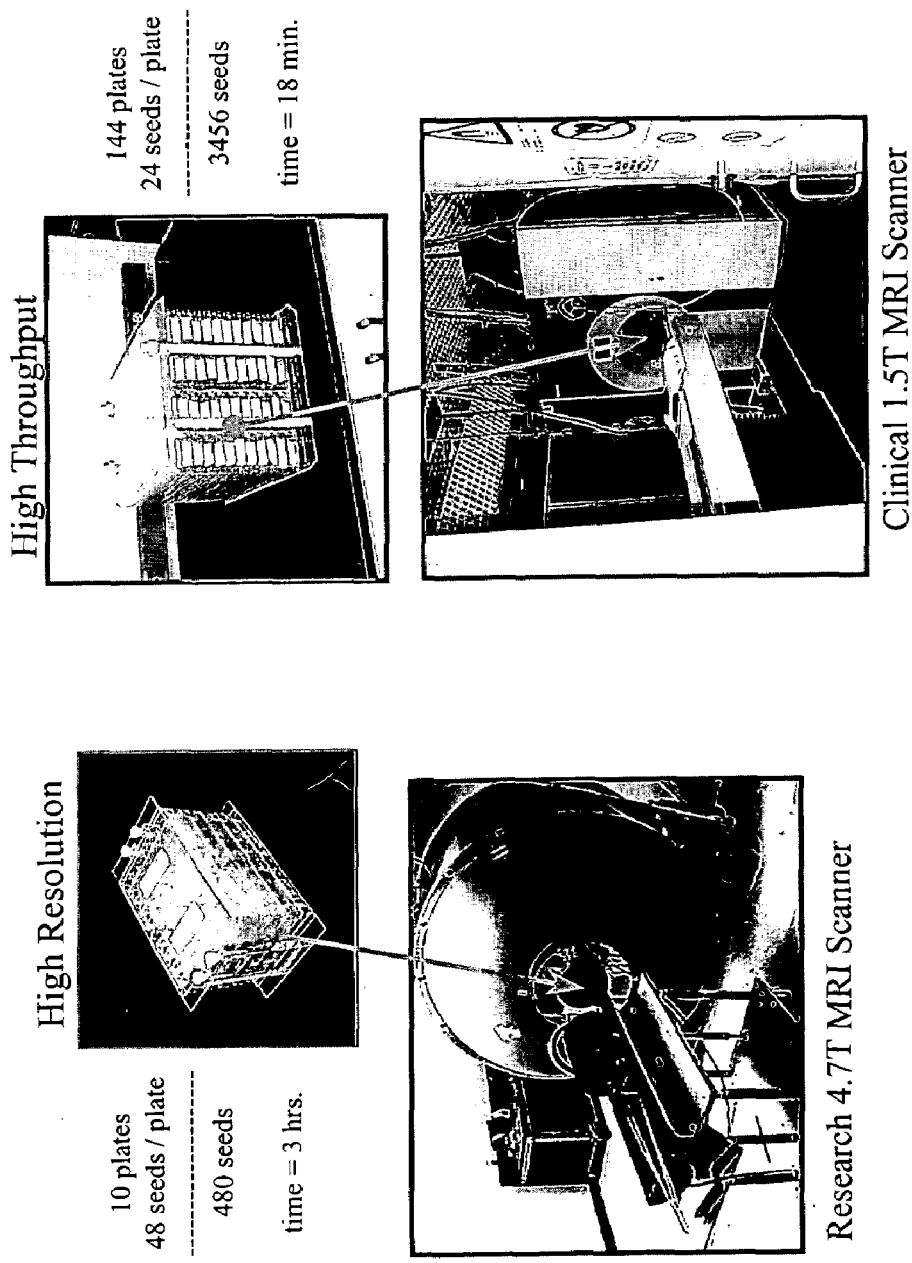

FIG. 6 is a comparison of the high resolution MRI screening experiment of the invention (FIG. 6a) and the high throughput MRI screening experiment of the invention (FIG. 6b). This clearly illustrates how the clinical MRI instrument is more amenable to larger sample cubes than a research MRI instrument. In FIG. 6a, the RF coil of the research instrument limits the size of the sample cube, in this case to 2 stacks of 5 layers of 48-well plates, for a total of 480 seeds. The higher magnetic field strength of the research magnet (4.7 T) allows for higher resolution images, but these high resolution images also require longer acquisition times (3 hours) and smaller sample sizes. Clinical instruments such as that shown in FIG. 6b, on the other hand, can accommodate much larger sample cubes. In this example there are 12 stacks of 12 layers of 24-well plates, for a total of 3456 seeds. While this clinical instrument is not the best system for obtaining the higher resolution imaging compared to the research magnet, it is better suited for high throughput imaging. Not only are there more than seven times the number of seeds imaged simultaneously when compared to the research instrument, the lower resolution imaging experiment takes only 18 minutes, one-tenth the amount of time required by the higher resolution imaging experiment. Thus, in this example, more than 70 times the number of seeds that can be analyzed in a given amount of time using the research instrument can be analyzed using the clinical instrument. By altering the data acquisition parameters, high resolution images can be otained using the clinical instrument. This change will considerably increase the amount of time it takes to acquire the data.

Figure 7:
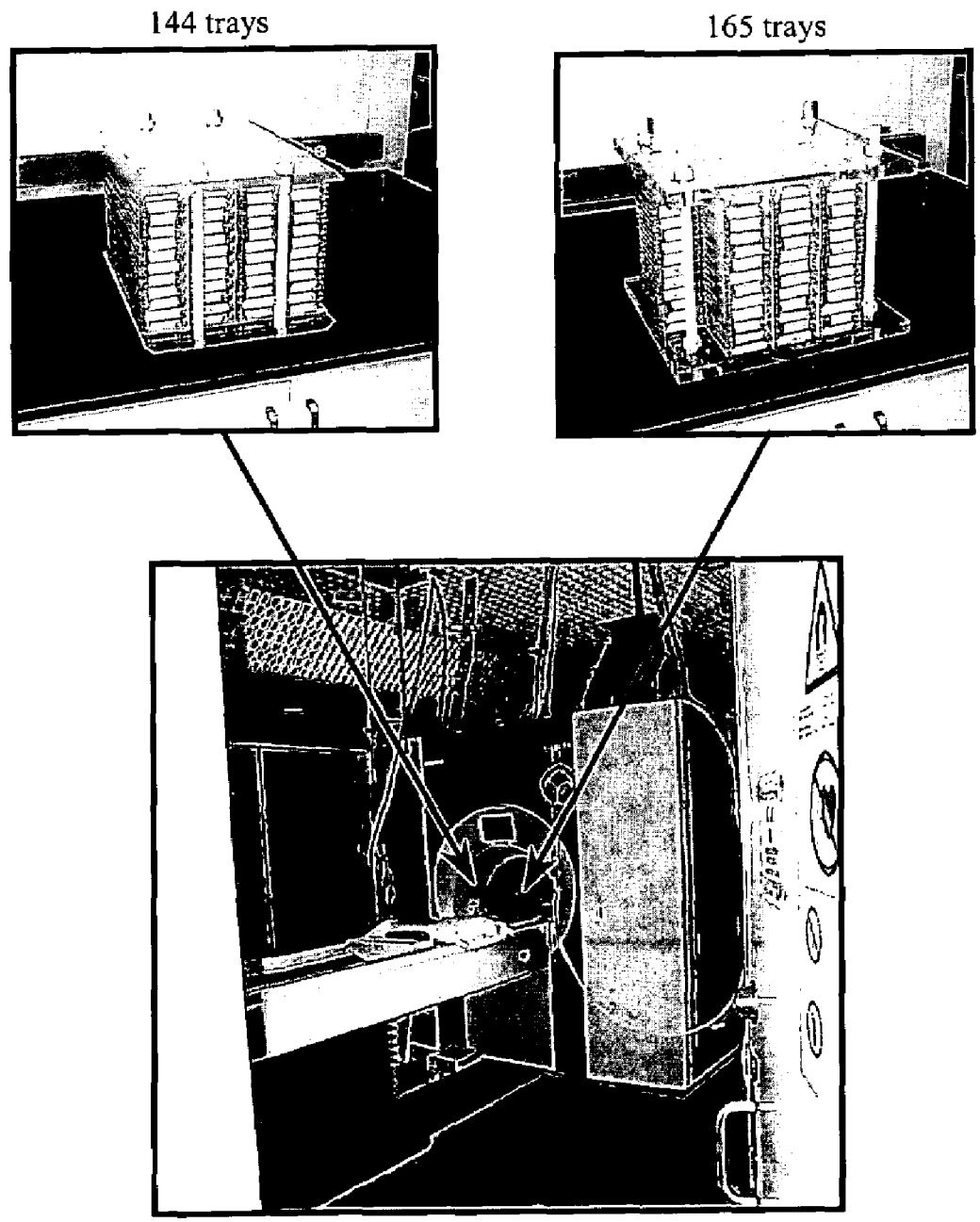

FIG. 7 shows two embodiments of the sampling device of the invention. These embodiments are just two of several possible different designs for the higher quantity sample cubes, each of which is preferably used in a clinical MRI instrument.

Figure 8:
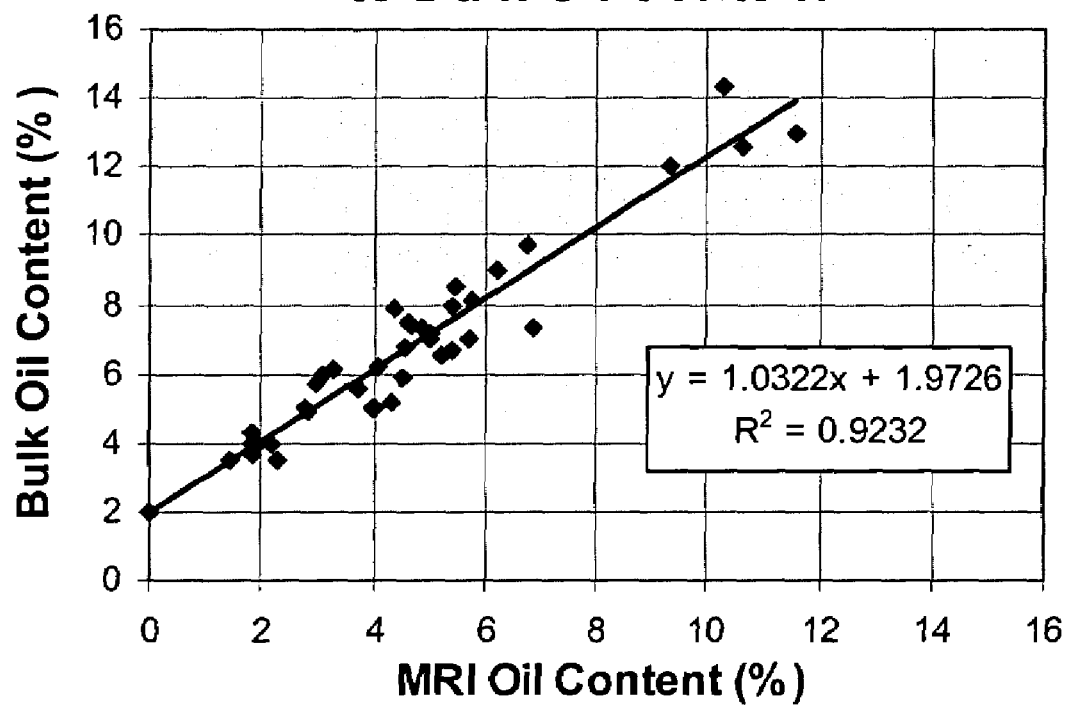

FIG. 8 is a graph showing the correlation between measurements of oil content using MRI and using infrared (IR) spectroscopy.

Figure 9:
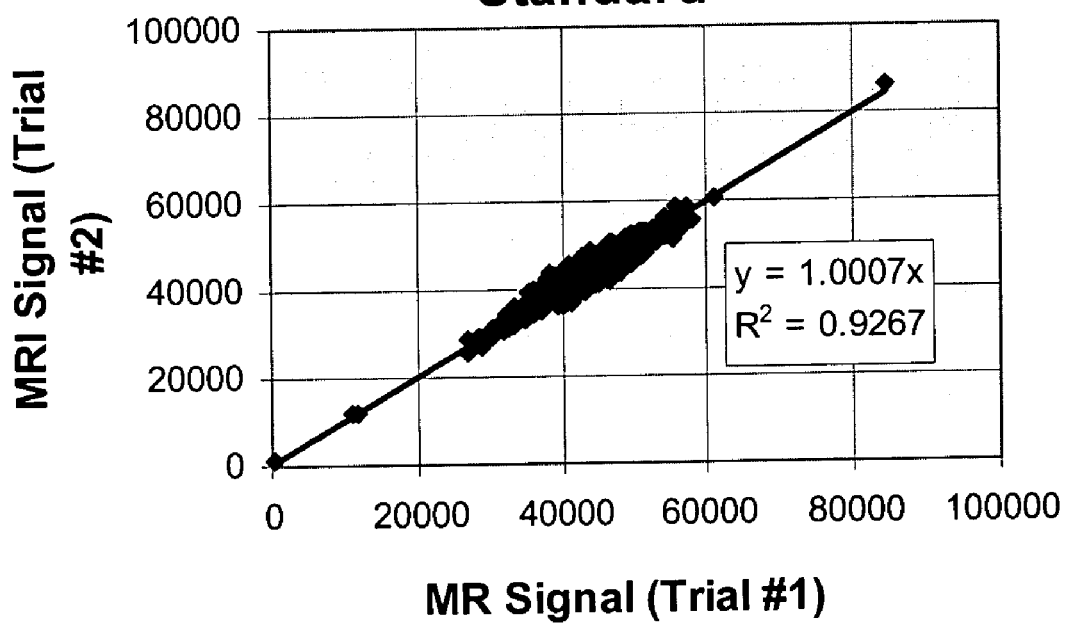

FIG. 9 is a graph showing comparisons between the results of MRI analyses of the oil content of the same seeds at two different times on the same day.

Figure 10:
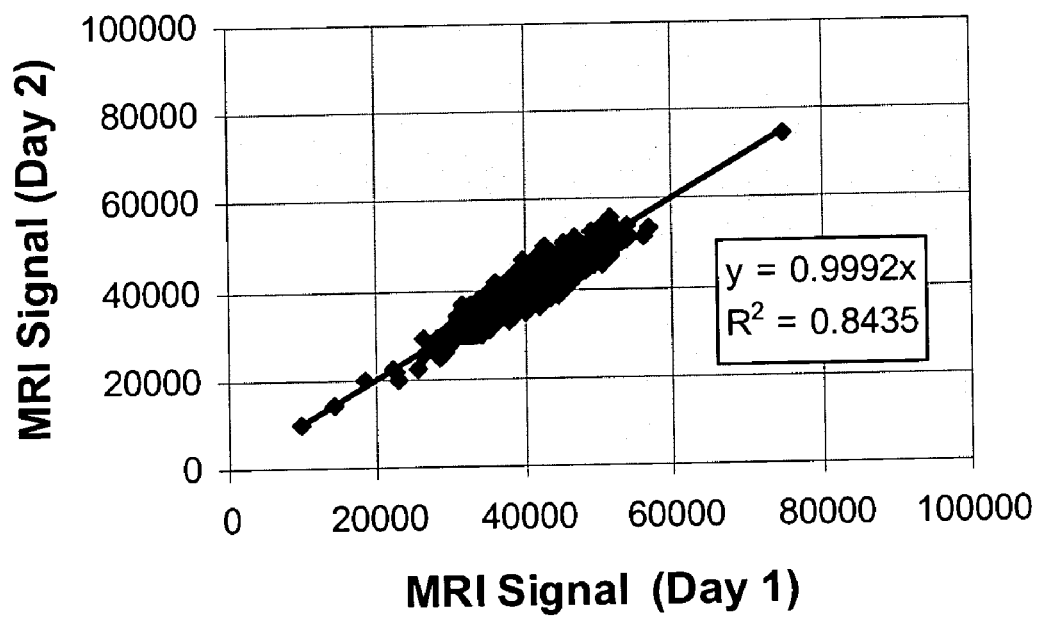

FIG. 10 is a graph showing comparisons between the results of MRI analyses of the oil content of the same seeds on two different days.

Figure 11:
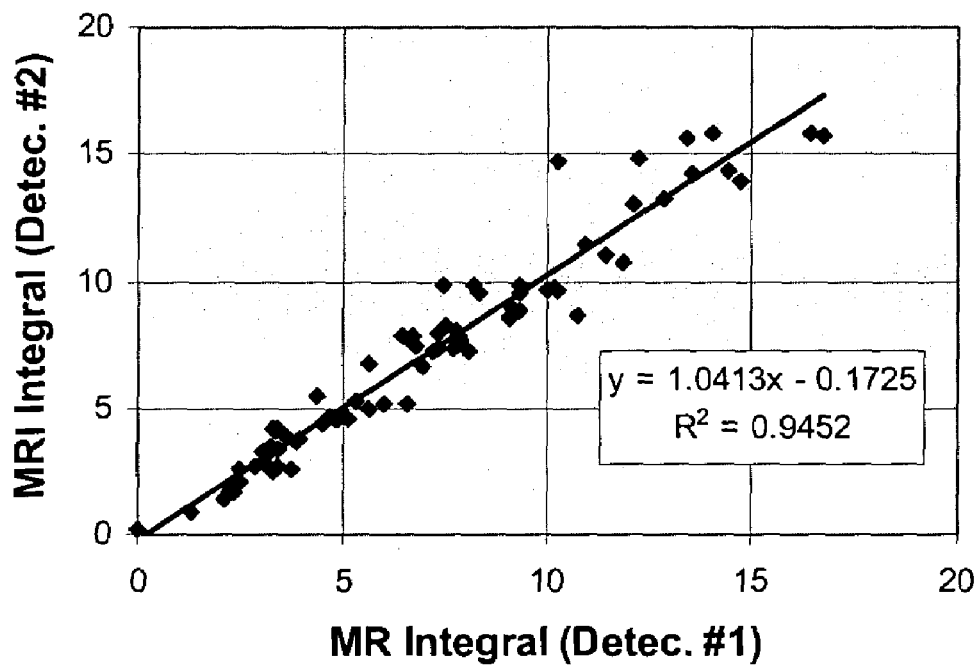

FIG. 11 is a graph showing comparisons between the results of MRI analyses of the oil content of the same seeds using two different MRI instruments.

Figure 12:
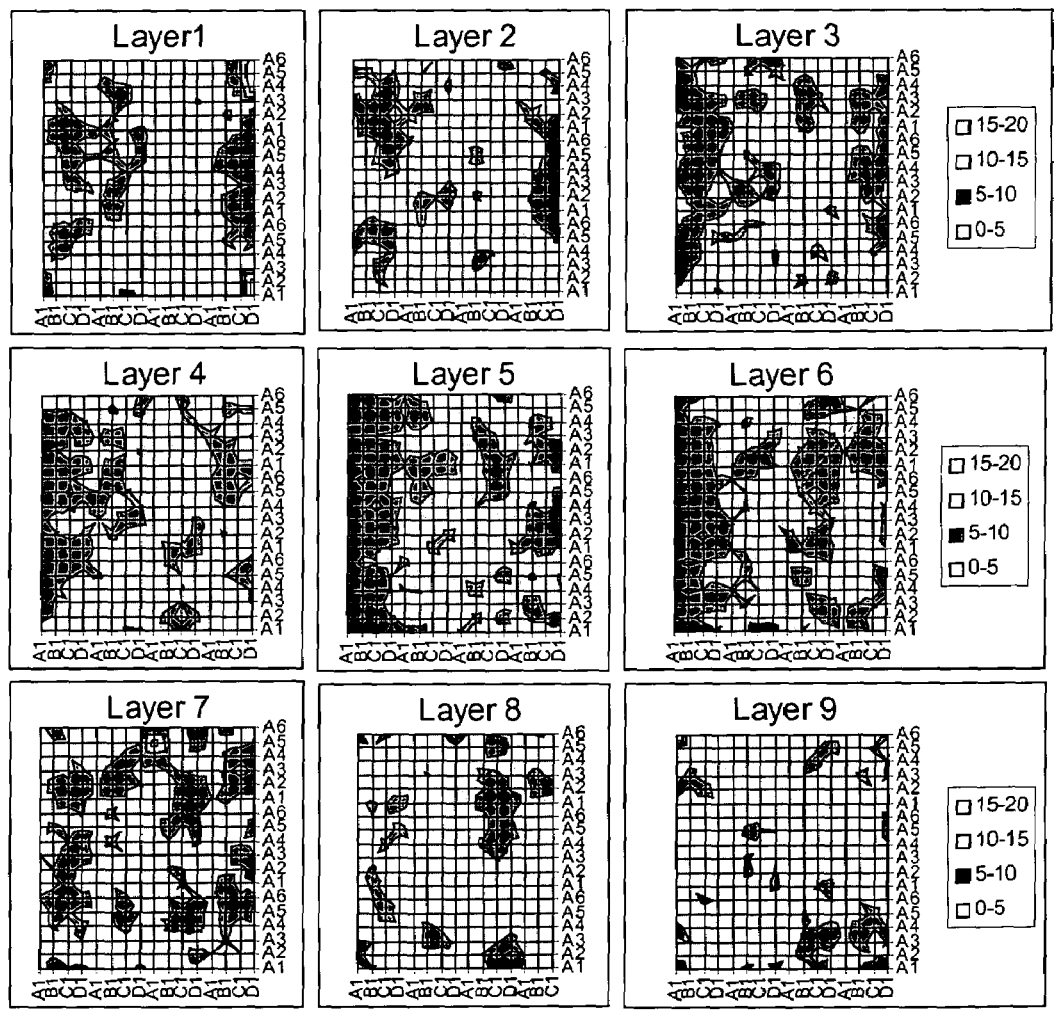

FIG. 12 is a map of the percent standard deviation relative to the mean for each well position in each of nine layers of a calibration standard cube.

DETAILED DESCRIPTION OF THE INVENTION

The present invention is an improvement over existing MRI techniques for measuring characteristics of seeds, and it further provides methods for selectively breeding plants in order to improve properties such as seed oil content. The invention provides a method for using clinical (or other large bore) MRI instruments to analyze small samples such as seeds. Smaller research grade MRI magnets have bore sizes and RF and detection coil diameters that are significantly smaller than those of clinical grade and larger research grade MRI magnets. This difference presents both advantages and disadvantages for determining characteristics of small specimens such as seeds. One advantage of research grade instruments is that the detection coils are closer to the specimen under investigation, so the sensitivity of the instrument is greater, and consequently the signal-to-noise ratio is greater. However, a significant disadvantage is that the active volume is inherently smaller in small bore research grade instruments. The active volume as used herein is defined as that volume within the instrument wherein the sample under investigation can be placed such that an image can be obtained from the sample without significant distortions. The imaging volume is limited by, for example, homogeneity of the strong magnetic field, linearity of the field gradients, and the homogeneity of the RF detection coil. Significant strong magnetic field inhomogeneities, field gradient nonlinearities, and RF detection coil inhomogeneities (collectively referred to herein as "field defects") in any regions inside the instrument cause distortions in the images of the sample obtained from those regions. Small distortions of these types can be compensated by, for example, correcting the field defects or by post-image acquisition data correction, but there will invariably be regions in the instrument where the distortions are too substantial to correct, and data from these regions is unusable.

Clinical grade instruments have larger active volumes than research grade instruments. For example, a typical small-bore research grade instrument (with, e.g., a 9 cm bore size) may have an active volume defined by a cylinder of, say, 4 cm diameter and 4 cm in length, whereas a clinical instrument, designed to accommodate substantial parts of a human body, may have an active volume defined by a cylinder of, say, 25 cm in diameter and 30 cm in length. The larger active volume of clinical grade instruments can therefore accommodate much larger sampling devices. For example, FIG. 6a shows a sample cube designed for a medium-bore research grade instrument. Its dimensions are approximately 15 cm×20 cm×12 cm, and it holds 480 seeds. FIG. 6b shows a sample cube designed for a clinical grade instrument. Its dimensions are approximately 30 cm×35 cm×30 cm, and it holds 3456 seeds. All other differences between the instruments aside, the active volume alone gives more than a seven-fold improvement in the number of seeds that can be analyzed simultaneously in the clinical grade instrument.

There are several obstacles that must be overcome in order to benefit from the larger active volume of clinical grade instruments to analyze small specimens such as seeds. One such obstacle is overcome by recognizing that the detection and RF coils must be loaded, or the detection and RF circuits must be re-tuned to account for the difference in the inductance of the detection coils between when the seed sample (giving a smaller inductance) and the human sample (giving a greater inductance) is in the coil.

There are three related issues that can present difficulties when magnetically imaging samples comprising specimens such as seeds. The first issue is that the magnetic susceptibility of organic material is drastically different than that of air. Thus the air gaps between seeds in a sample of many seeds and air gaps between the seeds and the intervening plastic material of the sampling device cause distortions in the otherwise uniform magnetic field as a result of the abrupt spatial variations in the magnetic field lines. These distortions in the strong magnetic field cause variations in the magnetic field strength experienced by different regions of a sample. Because different regions of the sample experience different magnetic fields, otherwise equivalent protons in those different regions precess at different rates. This causes a decrease in the dephasing times, which results in a more rapid loss of signal strength than in the absence of the susceptibility differences.

The second issue that can present difficulties when magnetically imaging samples such as seeds is nonlinearities in the field gradients. Field gradient nonlinearities create difficulties with mapping actual regions in the sample to volume elements within an image of the sample. In extreme cases, such nonlinearities can make the image data intractable. Gradient nonlinearities are of particular concern with larger samples because linear gradients are more difficult to maintain over longer distances.

The third issue that can present difficulties when magnetically imaging samples such as seeds is inhomogeneities in the RF dection coils. RF coil inhomogeneities create difficulties with quantitating actual regions in the sample to levels of the detect material in the sample. In extreme cases, such inhomogeneiteis can make the image data intractable. RF detector inhomogeneities are of particular concern with larger samples because homogeneous fields are more difficult to maintain over longer distances.

Methods for Analyzing Seeds Using MRI

It is an aspect of the present invention to provide a method for determining whether a seed exhibits a trait or whether any seeds within a sample of seeds exhibit a trait. In this aspect of the invention, a sampling device is used to provide the seed or the sample of seeds for analysis by an MRI instrument. The MRI instrument is used to provide an image of the seed or of the sample of seeds. The resulting image is analyzed, and the presence or absence of the trait is determined on the basis of the analysis.

Seeds

Any seed can be utilized in a method or device of the present invention. In a preferred embodiment, the seed is selected from the group consisting of alfalfa seed, apple seed, banana seed, barley seed, bean seed, broccoli seed, castorbean seed, citrus seed, clover seed, coconut seed, coffee seed, corn seed, cotton seed, cucumber seed, Douglas fir seed, Eucalyptus seed, Loblolly pine seed, linseed seed, melon seed, oat seed, olive seed, palm seed, pea seed, peanut seed, pepper seed, poplar seed, Radiata pine seed, rapeseed seed, rice seed, rye seed, sorghum seed, Southern pine seed, soybean seed, strawberry seed, sugarbeet seed, sugarcane seed, sunflower seed, sweetgum seed, tea seed, tobacco seed, tomato seed, turf, wheat seed, and Arabidopsis thaliana seed. In a more preferred embodiment, the seed is selected from the group consisting of cotton seed, corn seed, soybean seed, rapeseed seed, rice seed and wheat seed. In an even more preferred embodiment, the seed is a corn seed.

Samples

Individual seeds or batches of seeds can be utilized with the methods and devices of the present invention. A "sample" of seeds is any number of seeds, or a single seed. In a preferred embodiment, a sample of seeds is greater than 10 seeds, more preferably greater than 20, 50, 500, 1,000 or 10,000 seeds. In another embodiment the sample of the seeds may be classified by its origin, such as seeds that are derived from a single ear, single plant or single plant cross. As used herein, "sample" is an object or collection of objects that are to be studied using an analytical technique such as MRI. A sample comprises one or more "specimens", which are the objects of study within the sample. The preferred specimens of the invention are seeds.

The individual seeds in a sample can be simultaneously analyzed with a method of the present invention. As used herein, "simultaneously" means any set of data that derives from a single analysis. A single analysis can be a single MRI experiments, or the average of multiple MRI experiments. Such simultaneous analysis can be the simultaneous analysis of a batch of seeds for one or more traits. Such simultaneous analysis can also be the simultaneous analysis of a seed for multiple traits. In one embodiment, more than one trait can be analyzed simultaneously, for example, both water and oil content can be analyzed simultaneously. In an alternative embodiment, more than 3, 4, 5, or 6 traits can be analyzed simultaneously. In other alternative embodiments, between 5 and 10 or between 10 and 20 traits can be analyzed simultaneously. In the preferred embodiment, the MRI experiment is directed to determining the oil content of seeds.

Traits

The methods of the present invention can be used to detect any trait that can be measured by magnetic resonance. In one preferred embodiment, the trait is a biochemical trait. As used herein, a biochemical trait is any trait that affects the chemical composition of the agricultural sample. In one embodiment the biochemical trait is selected from the group consisting of oil content, protein content, carbohydrate content, starch content, fiber content and water content. As used herein content refers to the amount of a component, e.g. 5 milligrams (mg) of protein per seed or 5 mg of protein per 10 grams of dry weight of tissue. The preferred traits are relative oil content and relative water content. The most preferred trait is relative oil content.

Damage to kernels caused during harvesting, drying, elevating, and moving grain through commercial channels can be determined with the methods of the present invention. Use of modern farming techniques, such as the use of field picker-sheller harvesters, has led to a much higher kernel moisture content in samples than if the samples were allowed to dry on the ear. High moisture content requires the use of artificial drying at temperatures in excess of 80° C., which can lead to stress cracks and kernel breakage. Kernel breakage indicators can include, but are not limited to, the ratio of vitreous to non-vitreous endosperm, kernel density, average kernel weight, pericarp quantity and quality, and kernel size and shape. The methods of the present invention can be used in the identification of breakage and breakage susceptibility, and in the identification of chemical and physical traits that can minimize these problems.

In any of the single seed and multiple seed analysis embodiments given above, the seed can be analyzed for more than one trait at a time. For example, traits corresponding to different chemical shifts or dephasing rates, or ranges of chemical shifts and dephasing rates and traits that have a cumulative effect within the same range can be simultaneously investigated. Also, different tissues of an individual seed can be analyzed separately. Using spectral modeling to differentiate between the two tissues, regions of contiguous image volume elements can be associated with any portion of a seed or plant tissue, such as, for example, the germ and the endosperm. The spectral data for the different portions can then be used to differentially analyze the different tissues of the seed. In the preferred embodiment, seeds are analyzed for relative oil content.

Sampling Devices

Sampling devices are used for providing samples. As used herein, "providing" means any method used to place a sample in a MRI instrument or any method used to hold a sample while it is in a MRI instrument.

In one embodiment, the seeds from a single source are provided together in the sampling device. The single source can be any source that provides seeds having a common genetic background, such as an ear of corn, a single plant, or the product of a single cross. Using this method, seeds from the batch are provided as a randomly provided group in the sampling device. As used herein, "randomly providing" a batch of seeds in a sampling device is a particular way of providing the seedsby disposing them in the sampling device without regard to orientation or separation of seeds at a later time. For example, a batch of 100 seeds that is poured into a large, single plexiglass plate for analysis is said to be "randomly provided."

Any sampling device can be used if that sampling device does not significantly interfere with magnetic resonance measurements. Sampling devices include, but are not limited to, devices such as containers made from plexiglass having, for example, 12, 24, 96, or 384 wells into which seed samples can be loaded for analysis. Other materials that may be used for construction of sampling devices are known to those skilled in the art of magnetic resonance imaging. Particularly preferred sampling devices are plates containing multiple wells that are stacked in multiple layers to provide a three-dimensional array of specimens to be analyzed in order to maximize the number of specimens analyzed in one imaging experiment.

In a preferred embodiment, seeds in a batch are provided in a sampling device that is capable of maintaining each seed in its own individual compartment. An "individual compartment" as used herein can be anything that can position each seed so that the seed can be identified as corresponding to a particular volume element within the image as measured by MRI. In one embodiment the sampling device comprises a flat surface and is disposed horizontally, and the individual compartments ("wells") are designated portions of the flat surface. In another embodiment, the sampling device comprises individual compartments having a floor and four walls arranged in a square pattern into which individual seeds can be provided. In yet another embodiment, the sampling device is a flat surface upon which is removably positioned individual compartments having only four walls. In this embodiment, either the flat surface or the individual compartments can be removed to allow sorting of the seeds. In a preferred embodiment, the sampling device comprises removably stacked multiple well plates with high well density to provide a greater number of identifiable positions in a smaller volume.

Data Acquisition and Analysis

A sample containing one or many seeds is placed in an MRI instrument, and an imaging experiment is performed using standard data acquisition techniques. Any magnetic resonance imaging instrument may be used in this invention, and any MRI experiment that is sensitive to the trait or characteristic of interest, such as CSI, SEI, or relaxometry may be used. Preferred MRI instruments are those that have a strong, homogenous magnetic fields greater than about 0.2 Tesla. Also particularly preferred are clinical MRI instruments with the detection coil built into the gradient insert such that the detection coil is much larger than in research grade instruments, and hence can accommodate much larger sample volumes. Particularly preferred MRI instruments are those that have a strong magnetic field greater than about 1 Tesla.

By using an MRI system with a large-bore magnet, e.g., a clinical or larger research MRI instrument, spatial discrimination of NMR signals for individual seeds is possible. This approach permits large numbers of seeds to be analyzed in a single MRI experiment. Specifically, the procedures described herein enable 3456 corn kernels to be measured simultaneously in less than 30 minutes. Preferred oil seeds such as soybean and canola can also be examined using similar high-throughput MRI methods. In any of the embodiments above for sample analysis, the time to perform the method for the entire batch can be less than 30 minutes, preferably less than 20 minutes. This short sampling time results in rapid throughput of samples relative to the prior art, and allows greater screening of crop samples within one breeding cycle. Preferred bore sizes are greater than 20 cm, 30 cm, 40 cm, or 50 cm.

In general, the sample size (or seed number per sample cube) for MRI analysis is dictated by physical limitations and performance characteristics of the MRI scanner and the MRI detection device (RF coil). The following factors control sensitivity in the experiment and consequently impact the sample throughput: (a) the main magnetic field strength, homogeneity, and bore size, (b) the RF MRI signal detector quality, size, and response characteristics, and (c) the imaging gradient strength, homogeneity, and linearity.

In a preferred embodiment, the pulse sequence for the MRI experiment is a spin-echo sequence that allows preferential detection of protons on hydrocarbon (oil) molecules. In this embodiment, signal intensity is related to quantity of oil. Thus a particularly strong image of a seed is indicative of a high oil content in that seed, while a weaker image is indicative of lower oil content. In an alternative embodiment, the pulse sequence for the MRI experiment is a chemical shift imaging sequence that allows detection of the full NMR spectrum of protons on hydrocarbon (oil) molecules. In this embodiment, the signal spectrum allows inference as to the type of oil. Thus, the presence of particular types of oil such as poly-unsaturated oils can be determined.

An image of the sample is constructed from the data using available software, such as Varian ImageBrowser™ (Varian, Inc., Palo Alto, Calif.) software. Such an image contains MRI signal intensities for each of the individual seeds (in an experiment studying multiple seeds). Image data can then be further processed in order to quantify the trait or traits being studied using data analysis techniques known to those skilled in the art. Results of all the analysis can be displayed in a user-friendly manner, showing the quantification analysis of the trait or traits being studied for each individual seed in a batch of seeds being studied.

Devices for Analyzing Seeds

It is an aspect of the present invention to provide a method for using larger bore MRI instruments in the analysis of low-inductance samples, such as samples comprising seeds. As detailed above, clinical grade MRI instruments have detection and RF coil circuits that are tuned to samples having larger inductances than samples of seeds. Consequently, the coils must be loaded, or the circuits must be retuned to match the smaller inductances of seed samples. The loading step can be as simple as placing a phantom sample within the detection coils, but outside of the volume that is imaged. Such a phantom sample can be, for example, a volume of water to simulate the human tissue that the clinical instrument is designed to image. Phantom samples are available from manufacturers of clinical MRI instruments (e.g., Siemens AG, Erlangen, Germany; GE Medical Systems, Milwaukee, Wis.). The alternative to loading the coil is to retune the instrument's detection and RF circuits so that the coils are made to be sensitive to the sample given its smaller inductance. If the coils are not loaded, or alternatively, if the circuit is not retuned, then there will be a dramatic loss of signal caused both by inefficient magnetization rotation by the RF coil (i.e., a putative 90° pulse will rotate the sample magnetization by less than 90°), and by inefficient detection. If the difference between the inductance the clinical instrument is tuned to and the actual inductance given a sample such as several seeds is great enough, no signal will be observable.

It is an aspect of the present invention to overcome the difficulties associated with imaging samples such as collections of seeds using larger bore research and clinical grade MRI instruments. In this aspect of the invention, the gradient field strength is set so that: (1) the field of view (the active volume) covers the entire sample to be imaged; (2) the number of two-dimensional (horizontal) image layers is set such that the number of image layers multiplied by the (vertical) thickness of the sample slices is approximately equal to the (vertical) height of the sample; (3) the number of pixels within each image layer is sufficient to resolve the seeds by enough pixels to avoid inter-pixel crosstalk. These three criteria are determinative of the field gradient to be used for an arbitrary sample within an arbitrary MRI instrument. However, these must be particularly chosen for larger bore research and clinical MRI instruments, whose field gradients are not appropriately set to image samples comprising specimens such as seeds. Each of these three criteria are discussed in more detail below.

A first criterion for determining the appropriate field gradients is that the instrumental field of view should cover the entire sample to be imaged. The purpose of this criterion is simply to ensure that all of the seeds in the sample are imaged. It also determines the dimensions over which the field gradients should be substantially linear.

A second criterion for determining the appropriate field gradients is that the number of two-dimensional image layers is set such that the number of image layers multiplied by the thickness of the sample slices is approximately equal to the height of the sample. This ensures that the entire height of the sample is imaged. Surprisingly, the optimal thickness of the image layers does not generally correspond to the thickness of the seeds to be imaged. Fewer slices (corresponding to greater thicknesses) require less imaging time and less data processing time for an equivalent amount of information. The greatest practical thickness should be the thickness of an individual specimen to be imaged, i.e., the thickness of a seed. But this is not the case; instead, the optimal thickness of the image layers is less than the thickness of a single seed. When the thickness of an image layer is set to be equal to the thickness of a single seed, the results of the imaging are frequently anomalous and unpredictable. In one example, a sample of seeds with equivalent oil contents gave results ranging from no signal at all from some of the seeds, and maximum detectable signal intensity from others. An unexpected solution to this problem was found by increasing the field gradient strength, thus causing a decrease in the slice thickness and an increase in the number of slices required to image the entire height of the sample. This solution was counterintuitive because: (1) it is common knowledge that imaging a smaller volume (as is done by imaging a thinner slice) results in weaker signals because there is less material contributing to the signal, and (2) imaging thinner slices requires imaging more slices in order to obtain image data from the same volume, and thus the experiment could take longer.

The optimal image slice thickness can be determined quickly and easily by one of ordinary skill in the art by following these steps: (1) obtaining a sample of seeds with known oil content; (2) selecting a starting image slice thickness; (3) obtaining MRI data for the sample of seeds with that image slice thickness; (4) comparing the relative oil content as measured by MRI to the known relative oil content of the seeds; and (5) if the measured relative seed oil content does not match the known relative seed oil content, reducing the image slice thickness and repeating steps (3)-(5) until the relative oil content as measured by MRI matches the known relative oil content of the seeds.

Figure 1:
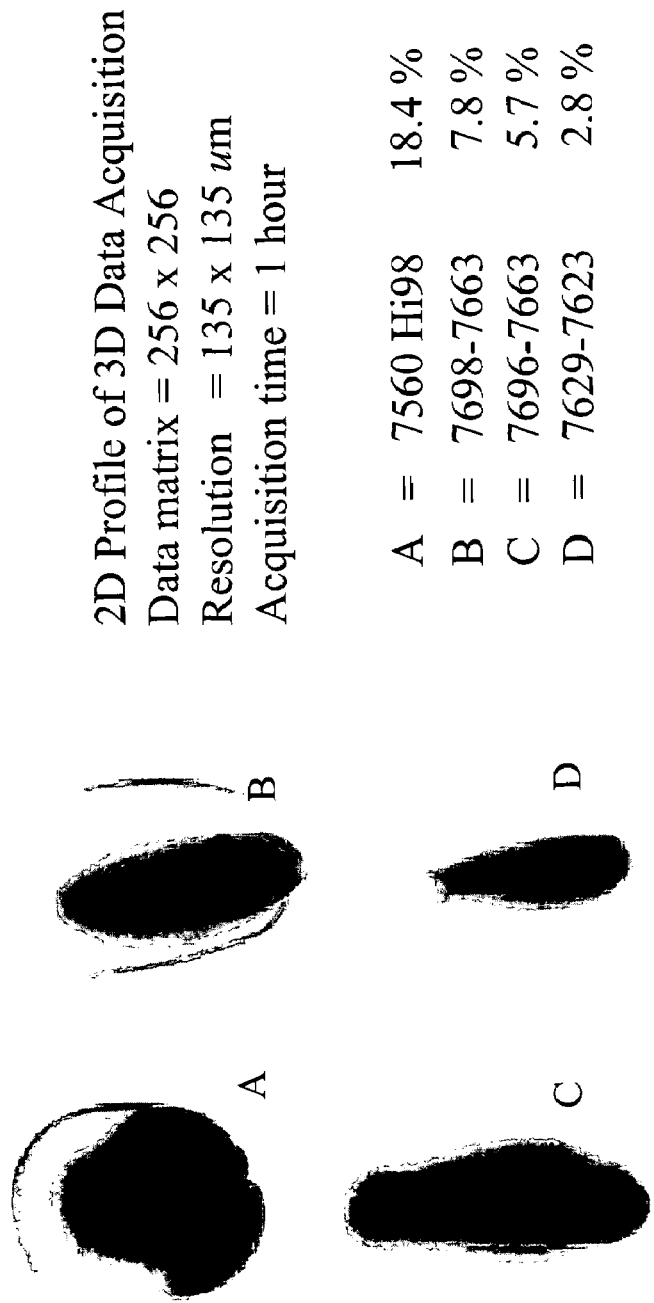
Figure 2:
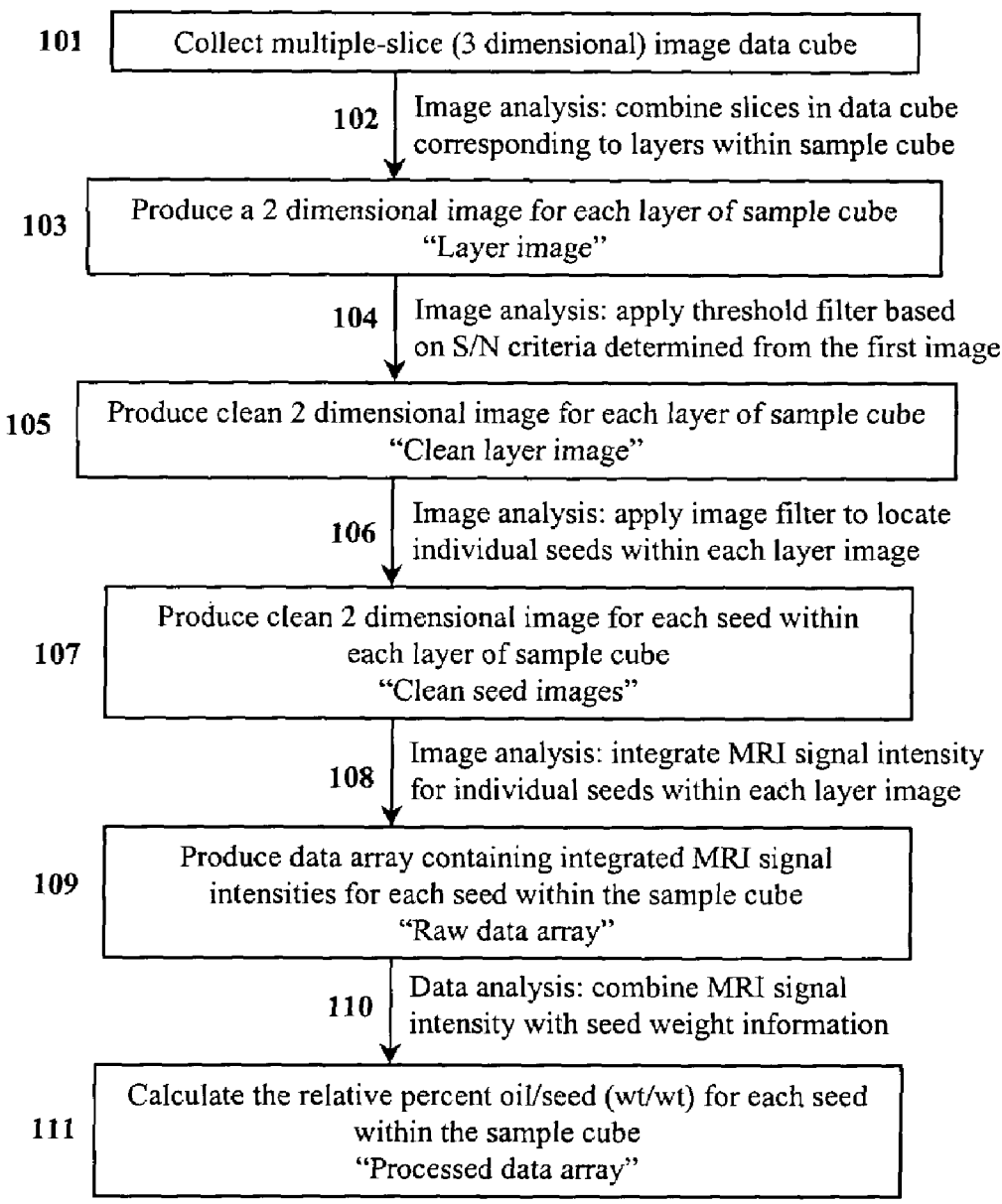
Figure 3:
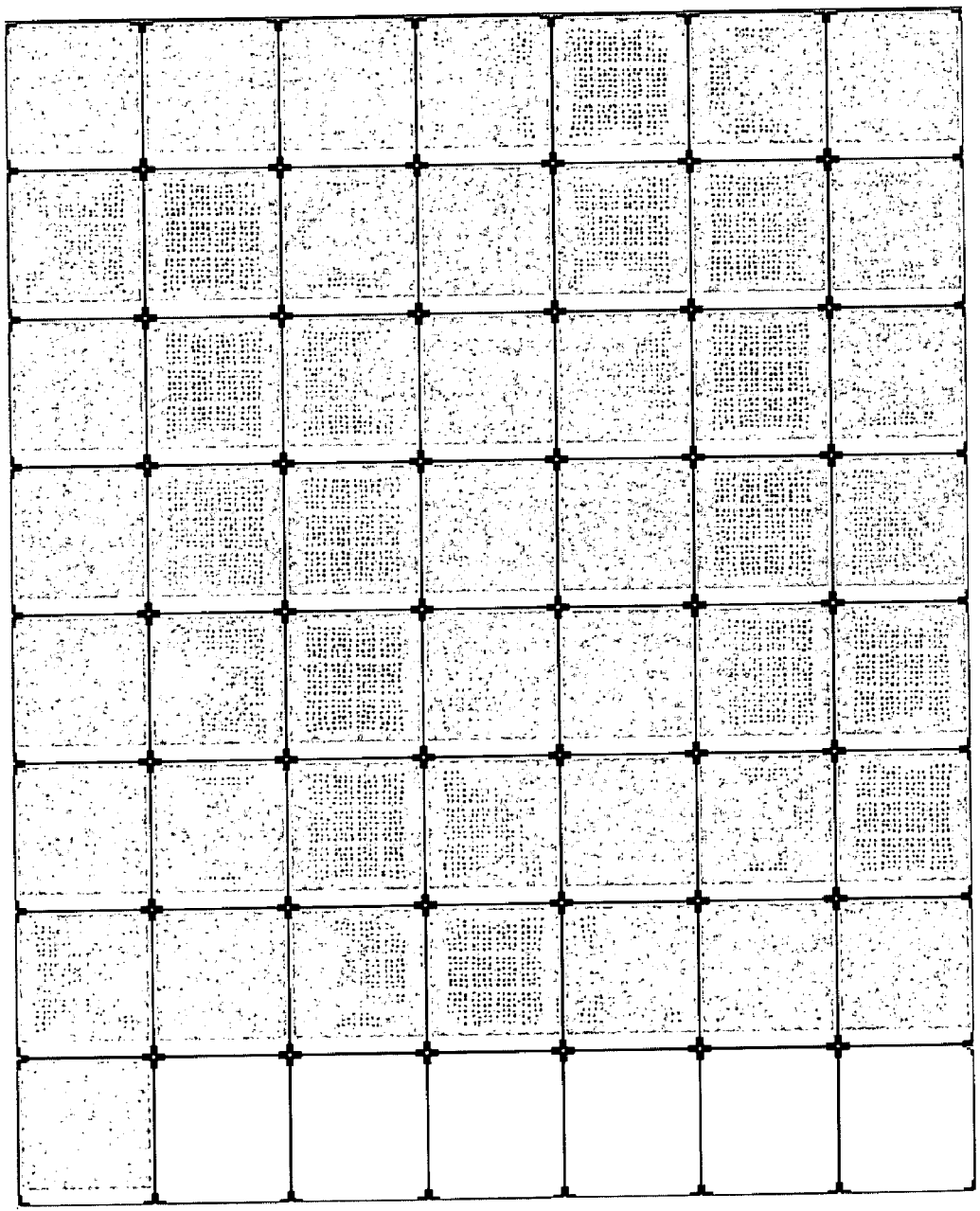
FIG. 3 shows the raw data from a 12 layer sample cube of corn seeds where each layer is comprised of 12 plates, and each plate has 24 wells, for a total of 3456 seeds.
Figure 4A:
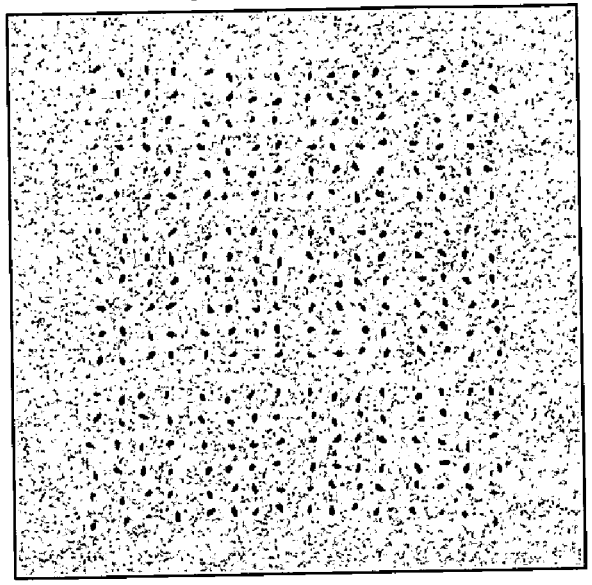
FIG. 4a is the combined data of several slices of the data cube corresponding to one layer of the sample cube and showing the data for 288 seeds.
Figure 4B:
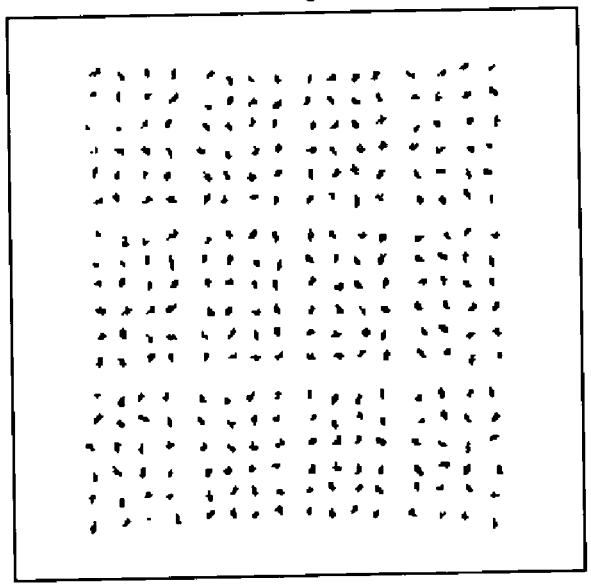
FIG. 4b is a representation of the data from FIG. 4a after application of a "threshold" filter.

An example of how the image slice thickness is set to less than the seed thickness is shown in FIG. 3. In that figure, subsequent image slices are shown. The fourth, fifth, and sixth frames of the top row show data acquired from a single layer of seeds. In the final analysis, these frames are combined into a single image (see FIG. 4a). The data analyzed from the combined image accurately reflects the relative oil content of the seeds therein, whereas an analogous experiment that collects the data from the entire layer of seeds in one image does not. In FIG. 3, the slice thickness was set to be approximately 5 mm. While the optimal slice thickness generally depends on the thickness of the seeds being imaged, it is generally contemplated that the optimal slice thickness is less than about 1 cm, preferably about 5 mm. The optimal slice thickness is less than about 95% of the thickness of the seeds to be imaged, preferably less than about 80% of the seed thickness, and most preferably about 75% of the seed thickness. The slice thickness would have to be independently determined based on the sizes of the seeds to be imaged. A lower limit could be determined wherein a further reduction is slice thickness would not be necessary.

A third criterion for determining the appropriate field gradients is that the number of pixels within each image layer should be sufficient to resolve the seeds by enough pixels to avoid inter-pixel crosstalk. Inter-pixel crosstalk occurs when an image pixel contains data derived from signals from more than one seed. The competing goals for this criterion are to minimize the number of pixels required to image one layer, thus minimizing the amount of time required to acquire data from one layer, but to have a sufficient number of pixels to avoid inter-pixel crosstalk. If the number of pixels is insufficient to avoid inter-pixel crosstalk, then the data for any particular seed will be contaminated with data corresponding to adjacent seeds, and thus accuracy is reduced for measurements of characteristics such as relative oil content. The optimal number of pixels required to image one layer depends on the density of seeds in the layer and the size of the seeds, with greater densities and smaller seeds requiring more pixels, and on a related parameter, the seed spacing. If the distance between seeds is approximately equal to the size of the seeds, then an optimal number of pixels would provide approximately four pixels between the seeds, and thus two pixels to represent one dimension of the seed in the image plane (for a total of two pixels for each dimension, or four pixels). The number of pixels per image layer should be sufficient to represent a single seed by between 1 and 40 pixels, preferably between 1 and 20 pixels, and most preferably between 4 and 10 pixels.

Methods for Analyzing and Sorting Seeds

The seed analysis described above can be coordinated with a sorting device that sorts and/or weighs each seed individually. In this embodiment, the sampling device has partitions to separate the individual seeds into cells. The bottom of the sampling device comprises doors that can be differentially opened to release any or all of the seeds, depending upon the programmed selection criteria. Alternatively, the sorting device can comprise differentially controllable movable vanes for each cell in the sampling device, thereby allowing the simultaneous discharge of the seeds into the sorting device.

Methods for Analyzing Multiple Traits

Quantitative chemical information for the sample can be extracted from the spectral data collected in an MRI experiment. It is well known that the protons in polyatomic organic molecules contained in biological materials exhibit characteristic chemical shifts and splittings based on their local functional groups and on nearby protons. By using chemical shift imaging, a full NMR spectrum can be measured for each volume element within the sample. Such measurements provide tremendous quantities of information about every seed within the sample. When used as a spectral imaging system, the present invention provides many advantages. Because spectral data can be collected from every unit of the sample, more accurate data can be obtained for bulk grain samples.

While the illustrated embodiments of the present invention includes magnetic resonance imaging in the radiofrequency spectral region, other spectral regions could be used, such as the microwave regions, for example, in an electron spin resonance experiment. Furthermore, as is known to those of skill in the art, other nuclei besides protons can be used in magnetic resonance experiments including magnetic resonance imaging experiments. Such nuclei include $^{13}C$, $^{14}N$, $^{15}N$, $^{17}O$, $^{19}F$, $^{31}P$, and $^{35}Cl$.

In an alternative embodiment of the invention, multiple pulse imaging techniques or back projection methods known to those skilled in the art of solid-state magnetic resonance can be used in an MRI experiment to quantify characteristics other than oil or water content. In this embodiment, components of plant tissues including, but not limited to, proteins, carbohydrates, lignin, cellulose, acid detergent fiber, neutral detergent fiber, and hydrated starch can be measured.

The methods of the present invention can be used to detect any trait that can be measured by magnetic resonance. In one preferred embodiment, the trait is a biochemical trait. As used herein, a biochemical trait is any trait that affects the chemical composition of the agricultural sample. In one embodiment the biochemical trait is selected from the group consisting of oil content, protein content, carbohydrate content, starch content, fiber content and water content. As used herein content refers to the amount of a component, e.g. 5 milligrams (mg) per seed of protein or 5 mg protein per 10 grams of dry weight of tissue. In another preferred embodiment the biochemical trait is selected from the group consisting of oil composition, protein composition, carbohydrate composition, and fiber composition. As used herein, composition refers to biochemical constituents of an agricultural sample, for example, the ratio of high molecular weight proteins to low molecular weight proteins or the ratio of saturated oils to non-saturated oils. Specific characteristics such as oil composition can be determined in the present invention by use of the chemical shift imaging (CSI) experiment, wherein each voxel of the three dimensional image contains a nuclear magnetic resonance spectrum of the matter in the region of the sample corresponding to that voxel. Thus, based on the NMR spectrum, the particular type of oil can be determined. The most preferred trait to be analyzed by the methods of the invention is the relative oil content of seeds.

In one embodiment, the methods of the present invention are used to differentiate starch samples with desirable phenotypes. Starch from normal dent or flint corn is composed of about 73% amylopectin (the starch fraction with branched molecules) and 27% amylose (the fraction with linear molecules). Waxy corn (having the wx gene) was first found in China, but waxy mutations have also been found in American dent strains. Starch from this mutant is 100% amylopectin. The endosperm mutant arnylose-extender (ae) increases the amylose fraction, of starch to 50% and above. The kernel of this corn is characterized by a tarnished, translucent, and partially full appearance. Several other mutant genes, either alone or in combination, affect starch composition by changing the amylose-amylopectin ratio. The characteristic firm opaque starch gel produced by common corn is attributed to the amylose fraction. Properties of the waxy corn starch are the result of the amylopectin sols produced having a characteristic soft translucent paste form. These differences in the native starch gel characteristics carry on through the starch modification processes and are desirable in certain applications. The methods of the present invention can readily discern the different mutant types and can be used as a high throughput, non-destructive screening technique for them.

In another embodiment, for example, the methods of the present invention are used to identify samples having desired endosperm traits. For example, several endosperm mutants that alter the balance of amino acids have been identified. It has been shown that the mutant lines opaque-2 (o2), floury-2 (fl2), and opaque-7 (o7) have reduced zeins (the protein in corn that lacks essential amino acids such as lysine and tryptophan) in the endospern and increased lysine. Kernels with the opaque-2 gene are characterized by a soft, chalky, non-transparent appearance, with very little hard vitreous endosperm. The methods of the present invention may be used to discern the different mutant types and levels of lysine, and therefore can be used as a high through-put, non-destructive screening technique for this trait.

In another embodiment the trait is a morphological trait. As used herein, a morphological trait is any structural trait. Preferred morphological traits are endosperm size, germ size, seed shape, seed size, seed color, seed surface texture, seed weight, seed density, and seed integrity. Seed integrity can be correlated with disease resistance or susceptibility. The presence of holes within a seed coat is often indicative of insect infection.

The correlation of a disease state with a structural change such as holes can be established by challenging samples of the seed to be tested with the organism. As used herein, a "sample" refers to any plant material that is being interrogated by a method of the present invention. A sample can be, for example, a fraction of a seed, a whole seed, more than one seed, and other plant tissues, among others. Controls can include seeds known to be susceptible and resistant. The correlation of the disease to a particular structural change can be established by an appropriate statistical analysis. It is understood that controls need not be run against a particular seed or seed batch once a correlation has been established.

One or more of the traits described above or any other trait that is detectable using magnetic resonance imaging can be simultaneously analyzed using the methods of the present invention. In one embodiment, two or more of the above traits or other traits are simultaneously analyzed. In another embodiment, three, four, five or more of the above traits or other traits measurable by MRI are simultaneously analyzed.

Analytical Systems

The present invention provides a device for measuring properties of agricultural products, comprising: a processing device for producing a sample; a sampling device for providing a sample, wherein the sampling device is disposed to receive the sample from the processing device; and, a magnetic resonance imaging system, wherein the system is disposed to analyze the sample in the sampling device. The present invention also provides a device for measuring properties of agricultural products, comprising: a sampling device for providing a sample; a magnetic resonance imaging system, wherein the system is disposed to analyze the sample in the sampling device; and, a sorting device for sorting the sample into two or more different groups, wherein the sorting device is disposed to receive the sample from the sampling device. The present invention further provides a device for measuring properties of agricultural products, comprising: a processing device for producing a sample; a sampling device for providing a sample, wherein the sampling device is disposed to receive the sample from the processing device; a magnetic resonance imaging system, wherein the system is disposed to analyze the sample in the sampling device; and, a sorting device for sorting the sample into two or more different groups, wherein the sorting device is disposed to receive the sample from the sampling device.

A sample can be prepared for analysis with a spectroscopic imaging system with a processing device. As used herein, a "processing device" is any device that is capable of separating the desired portion of a plant from the rest of the plant or plant part. In a preferred embodiment, the processing device is a sheller, a thresher, or a combine. The sheller can be, for example, an Almaco modified single ear corn sheller (Almaco, 99 M Avenue, P.O. Box 296, Nevada, Iowa 50201). As used herein, "producing a sample" refers to any method a processing device might use to separate the desired portion of a plant from the rest of the plant or plant part.

Other plant tissues or agricultural samples can be substituted for seeds. As used herein, plant tissues include, but are not limited to, any plant part such as leaf, flower, root, and petal. As used herein, agricultural samples include, but are not limited to, plant tissues such as seeds, but also include non-plant based material such as non-organic matter or non-plant based matter that occur in an agricultural context. Fungal samples are an example of an agricultural sample.

Other specimens besides plant tissues or agricultural samples can be substituted for seeds. The invention is generally useful for analyzing any type of specimen that would not normally be amenable to analysis using larger bore magnetic resonance instruments. Furthermore, the invention is generally useful for high-throughput analysis of samples comprising any type of specimen, whether or not that type of specimen would normally be amenable to analysis using larger bore magnetic resonance instruments. In one embodiment, specimens have volumes equivalent to a sphere with a diameter less than about 50 cm. In an alternative embodiment, specimens have volumes equivalent to a sphere with a diameter less than about 25 cm, more preferably less than about 10 cm, and most preferably less than about 1 cm.

After the sample is prepared with the processing device, it is analyzed by magnetic resonance imaging. After MRI analysis, the sample can be automatically sorted with a sorting device.

As used herein, a "sorting device" is any device that is capable of separating the sample into at least two different bins depending upon the results of the analysis. A sorting device can be, for example, a single movable vane that directs the sample in one of two directions. In a preferred embodiment, a sorting device is capable of independently sorting 10, 20, 50, or 100 individual seeds. As used herein, a "bin" is any device that can hold a portion of a sample separate from other portions.

In a preferred embodiment, the sorting device is capable of sorting a single batch of seeds into one of a multiple of bins. This type of sorting is most useful if more than a single trait is being examined during analysis.

In a preferred embodiment, a processing device and a sorting device are coupled to a sampling device and a spectroscopic imaging system to provide a device for automatically providing a sample, analyzing a sample, and sorting a sample. In a preferred embodiment, a sample can be provided, analyzed, and sorted faster than once every 5 minutes, more preferably faster than once every minute.

Selective Breeding Methods Based on Analyzed Traits

The present invention provides analytical methods for analyzing seeds having a desired trait. In an aspect of the invention, the analytical methods allow discrete portions or attributes of a single seed to be analyzed. Moreover, in another aspect of the present invention, the analytical methods allow individual seeds to be analyzed that are present in a batch or a bulk sample such that a distribution of a characteristic can be determined. Of particular interest is use of the present invention to analyze the oil content of seeds.

Methods and devices of the present invention can be used in a breeding program to select plants or seeds having a desired trait. In one aspect, the present invention provides a method for selecting a seed having a trait, comprising: (A) providing the seed in a sampling device; (B) obtaining a magnetic resonance image of the seed; (C) analyzing the data within the image; and (D) determining whether the seed exhibits each of the traits based on the analyzed data; (E) growing a fertile plant from the seed; and (F) utilizing the fertile plant as either a female parent or a male parent in a cross with a second plant.

Another aspect of the present invention provides a method of introgressing a trait into a plant, comprising: (A) providing the seed in a sampling device; (B) obtaining a magnetic resonance image of the seed; (C) analyzing the data within the image; (D) selecting the seed having the trait based on the analyzed data; (E) growing a fertile plant from the seed; and (F) utilizing the fertile plant as either a female parent or a male parent in a cross with a second plant.

The methods of introgression and selection of the present invention can be used in combination with any breeding methodology and can be used to select a single generation or to select multiple generations. The choice of breeding method depends on the mode of plant reproduction, the heritability of the trait(s) being improved, and the type of cultivar used commercially (e.g., $F_1$ hybrid cultivar, pureline cultivar, etc). Selected, non-limiting approaches, for breeding the plants of the present invention are set forth below. It is further understood that any commercial and non-commercial cultivars can be utilized in a breeding program. Factors such as, for example, emergence vigor, vegetative vigor, stress tolerance, disease resistance, branching, flowering, seed set, seed size, seed density, standability, and threshability etc. will generally dictate the choice.

For highly heritable traits, a choice of superior individual plants evaluated at a single location will be effective, whereas for traits with low heritability, selection should be based on mean values obtained from replicated evaluations of families of related plants. Popular selection methods commonly include, but are not limited to, pedigree selection, modified pedigree selection, mass selection, and recurrent selection. In a preferred embodiment a backcross or recurrent breeding program is undertaken.

The complexity of inheritance influences choice of the breeding method. Backcross breeding can be used to transfer one or a few favorable genes for a highly heritable trait into a desirable cultivar. This approach has been used extensively for breeding disease-resistant cultivars. Various recurrent selection techniques are used to improve quantitatively inherited traits controlled by numerous genes. The use of recurrent selection in self-pollinating crops depends on the ease of pollination, the frequency of successful hybrids from each pollination, and the number of hybrid offspring from each successful cross.

Breeding lines can be tested and compared to appropriate standards in environments representative of the commercial target area(s) for two or more generations. The best lines are candidates for new commercial cultivars; those still deficient in traits may be used as parents to produce new populations for further selection.

One method of identifying a superior plant is to observe its performance relative to other experimental plants and to a widely grown standard cultivar. If a single observation is inconclusive, replicated observations can provide a better estimate of its genetic worth. A breeder can select and cross two or more parental lines, followed by repeated selfing and selection, producing many new genetic combinations.

The development of new soybean cultivars entails the development and selection of soybean varieties, the crossing of these varieties and selection of superior hybrid crosses. The hybrid seed can be produced by manual crosses between selected male-fertile parents or by using male sterility systems. Hybrids are selected for certain single gene traits such as pod color, flower color, seed yield, pubescence color or herbicide resistance which indicate that the seed is truly a hybrid. Additional data on parental lines, as well as the phenotype of the hybrid, influence the breeder's decision whether to continue with the specific hybrid cross.

Pedigree breeding and recurrent selection breeding methods can be used to develop cultivars from breeding populations. Breeding programs combine desirable traits from two or more cultivars or various broad-based sources into breeding pools from which cultivars are developed by selfing and selection of desired phenotypes. New cultivars can be evaluated to determine which have commercial potential.

Pedigree breeding is used commonly for the improvement of self-pollinating crops. Two parents who possess favorable, complementary traits are crossed to produce an $F_1$. An $F_2$ population is produced by selfing one or several $F_1$'s. Selection of the best individuals in the best families is selected. Replicated testing of families can begin in the $F_4$ generation to improve the effectiveness of selection for traits with low heritability. At an advanced stage of inbreeding (i.e., $F_6$ and $F_7$), the best lines or mixtures of phenotypically similar lines are tested for potential release as new cultivars.

Backcross breeding has been used to transfer genes for a simply inherited, highly heritable trait into a desirable homozygous cultivar or inbred line, which is the recurrent parent. The source of the trait to be transferred is called the donor parent. The resulting plant is expected to have the attributes of the recurrent parent (e.g., cultivar) and the desirable trait transferred from the donor parent. After the initial cross, individuals possessing the phenotype of the donor parent are selected and repeatedly crossed (backcrossed) to the recurrent parent. The resulting parent is expected to have the attributes of the recurrent parent (e.g., cultivar) and the desirable trait transferred from the donor parent.

The single-seed descent procedure refers to planting a segregating population, harvesting a sample of one seed per plant, and using the one-seed sample to plant the next generation. When the population has been advanced from the $F_2$ to the desired level of inbreeding, the plants from which lines are derived will each trace to different $F_2$ individuals. The number of plants in a population declines each generation due to failure of some seeds to germinate or some plants to produce at least one seed. As a result, not all of the $F_2$ plants originally sampled in the population will be represented by a progeny when generation advance is completed.

In a multiple-seed procedure, for example, soybean breeders commonly harvest one or more pods from each plant in a population and thresh them together to form a bulk. Part of the bulk is used to plant the next generation and part is put in reserve. The procedure has been referred to as modified single-seed descent or the pod-bulk technique.

The multiple-seed procedure has been used to save labor at harvest. It is considerably faster to thresh pods with a machine than to remove one seed from each by hand for the single-seed procedure. The multiple-seed procedure also makes it possible to plant the same number of seed of a population each generation of inbreeding.

In one embodiment the present invention is used to differentiate haploid samples from non-haploid samples. The use of haploid plants increases the efficiency of recurrent selection in plant breeding programs by providing a way to produce completely homozygous lines of doubled haploid lines. Because haploids are hemizygous, i.e., only one allele per locus, they are useful for mutation studies and selecting against undesirable recessive alleles. Methods of the present invention can be used to discriminate haploid samples from other types of samples, such as diploids. Any haploid trait that produces a phenotype that produces reflected or transmitted light that has a different spectral composition than a non-haploid sample can be determined with the methods of the present invention. For example, some parental lines carry marker genes such as R-nj, which enable haploids to be identified at the stage of mature seeds by the anthocyainin coloration of the top of the endosperm and the lack of coloration in the embryo. Methods of the present invention can readily discern the presence or absence of these phenotypes at the required location on the seed.

Descriptions of other breeding methods that are commonly used for different traits and crops can be found in one of several reference books. See, e.g., Fehr, *Principles of Cultivar Development Vol.* 1, pp. 2-3 (1987).

In a preferred embodiment, the breeding trait of interest is oil levels or composition. In an even more preferred embodiment, the plant that is subject to a breeding program is a corn plant and the trait of interest is oil levels.

The following examples are illustrative only. It is not intended that the present invention be limited to the illustrative embodiments.

EXAMPLE 1

Images of corn kernels are obtained using a 1.5 tesla Magnetom™ Vision MR scanner (Siemens, Erlangen) using the standard whole-body resonator. The gradient strength is set to 25 mT/m on all axes. With the gradient booster, the full strength ramp time was 312 µs. The full gradient capabilities of the gradient set are not used in the seed imaging sequence. A spin-echo sequence is used (tr/te=1920/17 ms) with an excitation flip angle of 90° and refocussing flip angle of 180°. The receiver bandwidth is 130 Hz/pixel. The field-of-view is set to 450×450 mm. The data matrix obtained is 256×256. The images obtained from each sample cube consist of 50 contiguous coronal slices, acquired using the interleaved option, positioned so that there is at least one non-sample-bearing slice between each layer of samples in the cube. For the corn oil calibration standards, two scans are obtained, with the receiver gain set to 97.98 dB, and FFT scale factor set to 0.1. For the corn-seed samples, four scans are obtained, with the receiver gain set to 116.98 dB and the FFT scale factor set to 0.007114.

The sample cubes for the corn seed MRI analysis in these experiments contain 108 24-well plates. These are arranged in 9 layers of 12 plates each. This arrangement provides a total analytic capability of 2592 single corn seeds per sample cube.

Error Analysis

The accuracy and precision for the high-throughput analysis of oil content in corn seeds using MRI are summarized and can be tracked using the graphs of FIGS. 8-12. In general, the MRI methods are most useful for oilseeds containing greater than 1% oil by weight, although these methods are also useful for oilseeds containing less than 1% oil by weight. Seeds with lower oil levels generate lower signal intensities. The sensitivity of the technique can be improved to detect lower oil contents by, for example, lowering the threshold limit, increasing the data sampling times (or sensitivity), or otherwise improving the performance of the MRI scanner.

Comparison to bulk measurements. The average of the oil content on a large group of seeds determined using MRI should correlate with the bulk oil content for the seeds measured using an alternate technique, e.g., IR spectroscopy. This correlation is illustrated in FIG. 8, which shows a strong agreement between the two methods: y=1.0322x+ 1.9726; $R^2$=0.9232. Because MRI oil results are reported as relative numbers, these values are lower (by a constant offset) than the results obtained from the bulk oil measurement. The lower relative MRI numbers are expected due to signal loss attributed to relaxation processes that is known to occur in the MRI experiment.

Intra-day and inter-day comparisons in MRI oil measurements. The data obtained using MRI methods should correlate for different runs of the same sample, whether the data are acquired on the same day or on different days. These same day and different day comparisons for a corn oil calibration standard are shown in FIGS. 9 and 10, respectively. These data show good correlation for multiple runs of the same sample in both of these cases (same day: y=1.0007x, $R^2$=0.9267; different day: y=0.9992x; $R^2$=0.8435).

Variation in the MRI measurement using different instrumentation. The MRI signal RF detection coil is the major component of the hardware that affects the sensitivity or the signal-to-noise ratio in the MRI experiment. Each RF coil possesses a performance profile that is characteristic of its construction and physical geometry. Results obtained on two different devices can be compared to confirm the reproducibility between two hardware arrangements. Such a comparison is shown in FIG. 11 for a Varian (Varian, Inc., Palo Alto, Calif.) and a Monsanto (Monsanto, St. Louis, Mo.) MRI detection coil using a standard oil sample. Both detectors yield essentially identical results for the integrated MRI signal intensity (y=1.0413x−0.1725; $R^2$=0.9452) on a measured amount of corn oil in the standard sample.

Coefficient of variation for MRI methods. The coefficient of variation for the MRI data measured for each layer in a sample cube provides a reasonable estimate of the error in the MRI measurement. A map for each of the nine layers in one of the calibration standard cubes is shown in FIG. 12, which plots the percent standard deviation (N=8) relative to the mean for every well position in the cube. Roughly 90% of the well positions in most layers show less than a 5% error, and the remaining positions show 5-10%. A couple of positions, e.g., the upper left corner in layer 1, show an error greater than 10%. Larger errors can be expected near the corners of the cube relative to the center of the cube, where the magnetic field homogeneity and the MRI signal response is degraded.

EXAMPLE 2

48-well sample trays are loaded with oil seeds including corn, soybean, and canola. Two stacks of 5 plates containing individual seeds are placed in plexiglass sample holders to make an array comprising a total of 480 seeds. An array of seeds is inserted into a commercially available MRI detection coil that is large enough to accommodate the sample holder. An MRI coil containing the seeds is inserted into the MRI magnet for data collection using standard, non-proprietary data acquisition techniques. MRI data is sent to a computer, where it is processed using a custom macro in Varian ImageBrowser™ (Varian, Inc., Palo Alto, Calif.) software to obtain MRI signal intensities for each of the individual corn kernels in the sample. The resulting data is used to calculate the percentage of oil by weight in each of the 480 seeds within the sample.

EXAMPLE 3

A 1.5 tesla clinical grade MRI scanner is used to analyze a sample of 3456 seeds organized in 12 layers of 12 24-well trays. The experiment is conducted according to the protocol set forth in Example 2, above.

EXAMPLE 4

The oil content of corn kernels as determined by the protocol described above is used to breed corn plants with higher oil content. LH185(2)×BHO is the source material for generation 1. This seed was planted and the resulting plant is used as a female in the breeding program. This plant was crossed by haploid induction stocks including Stock 6 and KHI1. The seed produced is harvested and dried. With the aid of a marker system to identify putative haploid kernels (R-Navajo system), haploid seeds are isolated from the seed produced. This seed is then analyzed using the method set forth above in Example 1 to identify the seeds with the greatest oil content. Only the seeds with the greatest oil content are advanced to the next generation. In generation 2, these kernels are planted and treated with a chromosome doubling agent to produce dihaploid inbred lines.

EXAMPLE 5

The seeds from the plants resulting from Example 4 are planted and the resulting plants were pollinated with KHI1. After harvest and drying, putative haploid kernels are selected using the R-Navajo selectable marker system. These kernels are placed in 24 well plantes and analyzed using MRI as in Example 1 to determine oil content. The kernels with the greatest oil content are selected and planted. The resulting plants are treated with a doubling agent and self pollinated to create dihaploid inbred lines.

All articles, patents, and patent applications cited herein are incorporated by reference in their entirety.

What is claimed is:

1. A non-destructive method for determining whether a seed exhibits a trait, the method comprising:
   providing a plurality of seeds in a sampling device, said sampling device comprising a plurality of stacked trays, each tray containing a plurality of wells, a plurality of the wells containing a seed to be imaged;
   magnetic resonance imaging of the sampling device to generate at least one magnetic resonance image of said plurality of seeds within the sampling device;
   analyzing said magnetic resonance image for information indicative of the presence of the trait; and,
   determining whether each individual seed exhibits said trait based on said analysis.

2. The method according to claim 1, wherein a magnetic resonance imaging instrument used to generate the magnetic resonance image is additionally loaded with a phantom sample to affect detection coil inductance.

3. The method according to claim 1, wherein coils within a magnetic resonance instrument used to generate the magnetic resonance image are tuned to the inductance of the plurality of seeds within the sampling device.

4. A non-destructive method for determining whether a seed exhibits a trait, the method comprising:
   providing a plurality of seeds in a sampling device;
   generating a magnetic resonance image of said plurality of seeds;
   analyzing said magnetic resonance image for information indicative of the presence of the trait; and,
   determining whether each individual seed exhibits said trait based on said analysis, wherein said trait is relative oil content of each individual seed.

5. The method according to claim 4, wherein said trait is information concerning saturated versus non-saturated oil composition of each individual seed.

6. The method of claim 4 wherein said sampling device comprises a sample tray containing a plurality of wells, a plurality of the wells containing a seed to be imaged.

7. The method of claim 6 wherein the plurality of wells exceeds fifty in number.

8. The method of claim 4 further including the step of physically sorting the plurality of seeds based on the detected presence of the trait of interest.

9. A non-destructive method for determining whether a sample comprising a plurality of seeds contains seeds which exhibit a trait, the method comprising:
providing said sample in a sampling device, said sampling device comprising a plurality of stacked trays, each tray containing a plurality of wells, a plurality of the wells containing at least one seed to be imaged;
magnetic resonance imaging of the sampling device to generate at least one magnetic resonance image of said seeds within the sampling device;
analyzing said magnetic resonance image for information indicative of the presence of the trait; and
determining whether each individual seed in said sample exhibits said trait based on said analysis, wherein said determining step comprises associating said seeds with corresponding image volume elements that provide information indicative of the presence of the trait.

10. The method according to claim 9, wherein coils within a magnetic resonance instrument used to generate the magnetic resonance image are tuned to the inductance of the sample within the sampling device.

11. A non-destructive method for determining whether a sample comprising a plurality of seeds contains seeds which exhibit a trait, the method comprising:
providing said sample in a sampling device;
generating a magnetic resonance image of said sample;
analyzing said magnetic resonance image for information indicative of the presence of the trait; and
determining whether each individual seed in said sample exhibits said trait based on said analysis,
wherein said determining step comprises associating said seeds with corresponding image volume elements that provide information indicative of the presence of the trait, and
wherein said trait is relative oil content of each individual seed.

12. The method according to claim 11, wherein said trait is saturated versus non-saturated oil composition of each individual seed.

13. The method of claim 11, wherein said step of providing said sample of seeds in a sampling device comprises the step of providing an individual compartment within said sampling device for each of said seeds, the method further comprising the step of individually physically sorting the seeds after said step of determining based on whether said seed exhibits said trait.

14. The method as in claim 11, wherein said sample comprises more than 10 seeds.

15. The method as in claim 14, wherein said sample comprises more than 20 seeds.

16. The method as in claim 15, wherein said sample comprises more than 50 seeds.

17. The method as in claim 11, wherein said method can be performed on said sample in less than about 30 minutes.

18. The method as in claim 17, wherein said method can be performed on said sample in less than about 20 minutes.

19. A non-destructive method for high-throughput analysis of seeds for content, the method comprising:
providing a plurality of seeds in a sampling device, said sampling device comprising a plurality of stacked sample trays, each sample tray containing a plurality of wells, a plurality of the wells containing a seed to be imaged;
magnetic resonance imaging of the sampling device to generate at least one magnetic resonance image of said seeds within the sampling device;
analyzing said magnetic resonance image for information indicative of content presence; and,
determining a quantified amount of content presence within each individual seed based on said analysis.

20. The method of claim 19, wherein the seeds are oil seeds.

21. The method of claim 19, wherein said magnetic resonance image is obtained using a magnetic resonance imaging instrument with a bore size greater than about 8 cm.

22. The method of claim 19 wherein the plurality of wells on each tray exceeds fifty in number.

23. The method of claim 19 wherein the seeds comprise more than fifty individual seeds.

24. The method of claim 19 wherein the method is performed on the seeds in less than about 20 minutes.

25. A non-destructive method for seed trait analysis, the method comprising:
generating a single magnetic resonance image of a plurality of distinct seeds;
analyzing said single magnetic resonance image for information indicative of the presence of a certain trait of interest;
determining which one or ones of the plurality of distinct seeds possess the certain trait of interest based on said analysis; and
physically sorting the plurality of seeds based on the detected presence of the trait of interest.

26. The method of claim 25 wherein the plurality of seeds are contained within a sampling device, said sampling device comprises a plurality of stacked sample trays, each sample tray containing a plurality of wells, a plurality of the wells containing a seed to be imaged.

27. The method of claim 25 wherein the step of determining further includes the step of determining from the analysis of the magnetic resonance image information an amount of the trait of interest that is detected as being present within each individual seed.

28. The method of claim 27 further including the steps of:
measuring a weight of each seed in the plurality of seeds; and
calculating a relative percentage of the detected amount of the trait of interest by measured weight for each individual seed.

29. The method of claim 27 wherein the trait of interest comprises oil within the seed, and the step of determining detects a quantity of oil present within each individual seed.

30. The method of claim 25 further including the step of loading a magnetic resonance instrument used to perform the step of generating with a phantom sample in order to compensate for a relatively small inductance of the plurality of seeds.

31. The method of claim 25 further including the step of returning a clinical magnetic resonance instrument used to perform the step of generating in order to be more sensitive and compensate for a relatively small inductance of the plurality of seeds.

32. The method of claim 25 wherein the step of generating utilizes spin echo magnetic resonance techniques.

33. The method of claim 25 wherein the step of generating utilizes chemical shift magnetic resonance imaging techniques.

34. The method of claim 25 further including the step of locating each individual one of the plurality of seeds within the single magnetic resonance image.

35. The method of claim 25 wherein each individual seed comprises a tissue sample.

36. A non-desctructive method for seed trait analysis, the method comprising:
   (a) generating a single magnetic resonance image of a plurality of distinct seeds;
   (b) analyzing said single magnetic resonance image for information indicative of the presece of a certain trait of interest;
   (c) determining which one or ones of the plurality of distinct seeds possess the certain trait of interest based on said analysis as well as an amount of the trait of interest that is detected as being present within each individual seed;
   (d) measuring a weight of each seed in the plurality of seeds;
   (e) calculating a relative percentage of the detected amount of the trait of interest by measured weight for each individual seed;
   (f) processing a seed sample standard with known trait content in accordnce with the steps (a) to (e) to determine a correction factor; and
   (g) using the correction factor to correct the calcuated relative percentage of the detected amount of the trait of interest by seed weight.

* * * * *

UNITED STATES PATENT AND TRADEMARK OFFICE
CERTIFICATE OF CORRECTION

| | | |
|---|---|---|
| PATENT NO. | : 7,367,155 B2 | Page 1 of 1 |
| APPLICATION NO. | : 09/739871 | |
| DATED | : December 20, 2000 | |
| INVENTOR(S) | : John J. Kotyk and Kevin L. Deppermann | |

It is certified that error appears in the above-identified patent and that said Letters Patent is hereby corrected as shown below:

In claim 36, at column 27, line 11, replace "non-desctructive" with --non-destructive--.
In claim 36, at column 27, line 16, replace, "presece" with --presence--.
In claim 36, at column 28, line 12, replace "accordnce" with --accordance--.
In claim 36, at column 28, line 14, replace "calcuated" with --calculated--.

Signed and Sealed this

Twelfth Day of August, 2008

JON W. DUDAS
*Director of the United States Patent and Trademark Office*

UNITED STATES PATENT AND TRADEMARK OFFICE
CERTIFICATE OF CORRECTION

PATENT NO.         : 7,367,155 B2
APPLICATION NO. : 09/739871
DATED                 : May 6, 2008
INVENTOR(S)       : John J. Kotyk and Kevin L. Deppermann Page 1 of 1

It is certified that error appears in the above-identified patent and that said Letters Patent is hereby corrected as shown below:

In claim 36, at column 27, line 11, replace "non-desctructive" with --non-destructive--.
In claim 36, at column 27, line 16, replace, "presece" with --presence--.
In claim 36, at column 28, line 12, replace "accordnce" with --accordance--.
In claim 36, at column 28, line 14, replace "calcuated" with --calculated--.

This certificate supersedes the Certificate of Correction issued August 12, 2008.

Signed and Sealed this

Sixteenth Day of September, 2008

JON W. DUDAS
*Director of the United States Patent and Trademark Office*